(12) United States Patent
Bluzer

(10) Patent No.: US 8,455,829 B2
(45) Date of Patent: Jun. 4, 2013

(54) SERIES DIODE ELECTRO-THERMAL CIRCUIT FOR ULTRA SENSITIVE SILICON SENSOR

(75) Inventor: Nathan Bluzer, Rockville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 465 days.

(21) Appl. No.: 12/693,731

(22) Filed: Jan. 26, 2010

(65) Prior Publication Data

US 2011/0180710 A1    Jul. 28, 2011

(51) Int. Cl.
G01J 5/02        (2006.01)
(52) U.S. Cl.
USPC .................................. 250/339.03; 250/338.1
(58) Field of Classification Search
CPC ..................................... G01J 5/061; G01J 5/20
USPC ........ 250/338.1, 338.2, 338.3, 338.4, 339.03, 250/352
See application file for complete search history.

(56) References Cited

U.S. PATENT DOCUMENTS

| | | | |
|---|---|---|---|
| 6,048,092 | A | 4/2000 | Kimura et al. |
| 6,489,615 | B2 | 12/2002 | Bluzer |
| 7,064,328 | B2 | 6/2006 | Bluzer |
| 7,157,708 | B2 | 1/2007 | Bluzer |
| 7,253,412 | B2 | 8/2007 | Bluzer |
| 7,335,884 | B2 | 2/2008 | Lee et al. |
| 7,361,900 | B2 | 4/2008 | Bluzer et al. |
| 7,375,333 | B1 | 5/2008 | Bluzer et al. |
| 2002/0117622 | A1* | 8/2002 | Bluzer ....................... 250/338.1 |
| 2005/0087687 | A1* | 4/2005 | Bluzer .......................... 250/332 |
| 2006/0081780 | A1* | 4/2006 | Bluzer ....................... 250/338.1 |
| 2006/0081781 | A1* | 4/2006 | Bluzer ....................... 250/338.4 |
| 2007/0029484 | A1 | 2/2007 | Anderson et al. |

OTHER PUBLICATIONS

Wood, R.A., et al., "Uncooled Monolithic Silicon Focal Plane Development," Proc. IRIS Detector, vol. II, 1992, pp. 253-262.
Blundell, Raymond " Submillimeter Receivers for Radio Astronomy," Proceedings of the IEEE, vol. 80, No. 11, Nov. 1992, pp. 1702-1720.
Grossman, E. N., et al., "Far-Infrared Kinetic Inductance Detectors," IEEE Transactions on Magnetics, vol. 27, No. 2, Mar. 1991, pp. 2677-2680.
Kruse, P.W., et al., Elements of Infrared Technology: Generation, Transmission, and Detection (Wiley, New York, 1962), p. 354.
Lee, Hyung-Kew, et al., "A High Fill-Factor Infrared Bolometer Using Micromachined Multilevel Electrothermal Structurs," IEEE Transactions on Electron Device, vol. 46, No. 7, Jul. 1999, pp. 1489-1491.

* cited by examiner

Primary Examiner — Mark R Gaworecki
(74) Attorney, Agent, or Firm — Rothwell, Figg, Ernst & Manbeck, P.C.

(57) ABSTRACT

Electro-thermal feedback is utilized for reducing the effective thermal conductance between the detector stage of a bolometer pixel in a thermal radiation sensor assembly and the environment through its mechanical support structure and electrical interconnects, thereby coming closer to achieving thermal conductance limited primarily through photon radiation. Minimization of the effective thermal conductance associated with the mechanical support structure and electrical interconnects is achieved by electro-thermal feedback that adjusts the temperature of an intermediate stage and the mechanical support structure and electrical interconnects, connecting it to the detector stage, to equal the temperature of the bolometer pixel's detector stage (i.e., by active thermal isolation). Increased temperature sensitivity is preferably achieved through temperature sensing with reverse biased Schottky diodes connected in series.

35 Claims, 10 Drawing Sheets

SERIES DIODE ELECTRO-THERMAL CIRCUIT FOR ULTRA SENSITIVE SILICON SENSOR

GOVERNMENT RIGHTS NOTICE

This invention was made with government support under U.S. Government Contract No. W911QX-04-C0117. The Government has certain rights to this invention.

BACKGROUND OF THE INVENTION

1. Technical Field

This invention relates generally to ultra sensitive silicon sensors (USSS), and more particularly to an electro-thermal feedback circuit providing active thermal isolation using a series temperature-sensing diode configuration.

2. Description of the Background Art

Bolometers are used in many imaging applications because they provide spectral versatility. Bolometers are most commonly used in low cost and reduced sensitivity long-wavelength infrared (LWIR) cameras. Bolometers have also been used, at cryogenic temperatures, for microwave imaging. Bolometers inherently respond over a broad band and this makes them viable for imaging in different spectral bands.

Quantum detectors, operating above liquid Helium temperatures, offer better sensitivity and faster response than bolometers but are not spectrally versatile. The lack of spectral versatility with quantum detectors is particularly evident at mm-waves where no viable quantum detector technology exists. By contrast, in the visible spectrum, high performance solid state quantum detector cameras are commercially available. These imaging cameras are made in silicon and provide high performance e at low cost. Generally, cameras based on quantum detectors provide very impressive imagery at higher photon energies (0.5-2 eV). At lower photon energies (<0.5 eV), or longer wavelengths, quantum detectors require more expensive crystalline materials and complicated integrated circuit (IC) processing. Moreover, at mid-wavelength infrared (MWIR), or longer wavelengths, cryogenic cooling is needed to realize their full performance potential. Hence, quantum detectors have been limited to imaging at photon energies greater than about 0.1 eV, i.e., LWIR. Additionally, the requirement for cryogenic cooling of IR quantum detector is a constant detractor in terms of cost, weight and reliability.

The aforementioned issues with quantum LWIR cameras are the main impetus for searching for alternative approaches. In principle, bolometers with theoretically limited sensitivity are a commercially attractive competitor to quantum based LWIR cameras. Hence, large development efforts were started to improve the sensitivity of bolometers. The expectation is that with theoretically limited sensitivity, there are many applications where LWIR bolometers will offer a viable replacement to LWIR quantum detectors; with the advantages of room temperature operation, adequate sensitivity, good reliability, low cost, and low weight. Additionally, bolometers with theoretically limited sensitivity open the opportunities for room temperature mm-wave imaging cameras.

A bolometer's focal plane is made up of pixels assembled into an x-y array with associated readout circuits. A conventional bolometer pixel 9 and its thermal equivalent circuit are shown in FIGS. 1 and 2, respectively. A bolometer pixel 9, as shown in FIG. 1, includes an absorber element (i.e., detector) 10, represented by a rectangle with area $A_D$ that is mechanically supported by several low thermal conductance bridges 12, which sits atop of and are anchored to a thermal bath member 14 having a temperature $T_{HB}$. The detector 10 in each pixel acts as a photon absorber and has a temperature $T_1$. From a scene 8, at temperature Ts, photons (i.e., radiation power) hv are incident on detector 10, of pixel 9, and are absorbed and cause a temperature change $\delta T_1$ from $T_1$. As shown in FIG. 2, the detector's heat capacity is $C_1$, and the thermal conductance of the bridges 12 between the detector 10 and the heat bath 14 is $G_2$. The scene, at temperature Ts, is radiating energy hv at the detector 10, and this is represented in FIG. 2 as a thermal current $Q_R$. The detector 10, in addition to being mechanically attached to the heat bath 14 by the bridge's thermal conductance $G_2$, is radiating power $Q_{D1}$ and receiving $Q_{S1}$ from radiation shields (not shown) attached to heat bath 14. The performance of pixel 9 is analyzed by computing the signal and noise in terms of the small signal equivalent circuit of FIG. 2.

The analysis is based on small signal analysis technique developed for electronic circuits. Translation from a thermal to an electrical domain is made by treating temperatures as voltages; thermal conductances as reciprocal electrical resistances; and thermal currents as electrical currents. Specifically, temperatures $T_S$, $T_1$, $T_{HB}$ are treated as voltages. Thermal conductance between the heat bath 14 and absorber element 10 is modeled as a reciprocal resistance with conductance $G_2$. The heat capacity of absorber 10 is represented by capacitor $C_1$. The thermal currents are: from the scene $Q_R = \sigma T_S^4 A_D / 4F^2$; from the absorber 10 to the outside world $Q_{D1} = \sigma T_1^4 A_D$; and from the radiation shields to the absorber $Q_{S1} = \sigma T_{HB}^4 A_D [1 - 1/4F^2]$, where $\sigma = 5.6697 \times 10^{-8}$ W·m$^{-2}$·K$^{-4}$ and F is the optic's f-number. Functional differences between expression for $Q_R$, $Q_{D1}$, and $Q_{S1}$ are because photon flux arrives through different solid angles, accounted for by the lens's f-number. Additionally, the detector 10 conducts thermal energy, through conductances $G_2$, to the heat bath 14, at temperature $T_{HB}$. Analytically, the thermal balance conditions at the bolometer are represented as:

$$Q_R - Q_{D1} + Q_{S1} = \int_{T_{HB}}^{T_1} G_2(T) dT + \int_{T_1}^{T_1 + \delta T_1} j\omega C_1(T) dT \quad (1)$$

$$= \sum_{n=0}^{\infty} \left[ \frac{\partial^n G_2(T)}{\partial T^n} \bigg|_{T_{HB}} \frac{(T_1 - T_{HB})^{n+1}}{(n+1)!} + j\omega \frac{\partial^n C_1(T)}{\partial T^n} \bigg|_{T_1} \frac{(\delta T_1)^{n+1}}{(n+1)!} \right]$$

The temperature dependence of $G_2(T)$ and $C_1(T)$ are included in Equation (1).

Using small signal analysis on a conventional bolometer, shown in FIG. 1, it is reasonable to assume that the derivatives of $G_1(T)$ and $C_1(T)$ are a weak function of temperature. And for simplicity, only first order terms are retained. At equilibrium, or constant flux conditions, the bolometer's equilibrium temperature $T_1^0$ is obtained from Equation (1), for $\omega=0$, and is given by:

$$T_1^0 = T_{HB} + \frac{Q_R + Q_{S1} - Q_{D1}}{G_2 + 0.5 \frac{\partial G_2}{\partial T}(T_1^0 - T_{HB})} \quad (2)$$

Thus, at equilibrium, the temperature of absorber 10 is different from the heat bath temperature by the net bridge heat current divided by conductance $G_2^*$. As expected, the more power the absorber 10 receives, which is equal to $(Q_R + Q_{S1} - Q_{D1})$, the higher will be its operating temperature. Since the radiation shields are attached to the heat bath 14, their temperature [and $Q_{S1}$] is fixed to the heat bath's temperature. Thus the temperature of absorber 10 will change monotonically with changes in scene temperature $T_S$, and these temperature changes are maximized with minimum conductance $G_2^*$.

Under dynamic conditions, changes in the scene's temperature by $\delta T_S$ will produce changes in the absorber's temperature equal to $\delta T_1$, about the thermal equilibrium temperature $T_1^0$. Assuming the radiation shield is at a constant temperature (i.e., $\delta T_{HB} = \delta T_{S1} = 0$), the expression relating $\delta T_1$ to $\delta T_S$ is computed by taking the differentials of Equation (1) and Equation (2) and combining them. The relationship between $\delta T_1$ and $\delta T_S$ is given by:

$$\delta T_1 = \left(\frac{G_R}{G_{D1} + G_2^*}\right) \frac{\delta T_S}{1 + j\omega[C_1^*/(G_{D1} + G_2^*)]} \tag{3}$$

For brevity, $G_2^* = G_2 + (T_1^0 - T_{HB})\partial G_2/\partial T_1$ is used to account for the temperature dependence of $G_2(T)$. $G_R = \partial Q_R/\partial T_S = \sigma T_S^3 A_D/F^2$ is the thermal conductance between the scene and absorber, and $G_{D1} = \partial Q_{D1}/\partial T_1 = 4\sigma T_1^3 A_D$ is the conductance between the absorber and its surroundings.

According to Equation (3), a $\delta T_S$ change in the scene's temperature causes a $\delta T_1$ change in the absorber's temperature. Although signal $\delta T_1$ is monotonically related to $\delta T_S$, it is attenuated by the factor $G_R/[G_{D1}+G_2^*]$, and the changes are retarded by thermal time constant or radial frequency $\omega_{TM} = [G_{D1}+G_2^*]/C_1^*$. The signal is attenuated because: (a) the absorber reradiates at a wider solid angle that it received radiation from the scene [$G_{D1} > G_R$], and (b) a portion of the energy received from the scene is shunted to the heat bath 14 through conductance $G_2^*$. For maximum signal, conductances $G_{D1}$ and $G_2^*$ should be made as small as possible, and approach $G_R$.

Hence, much effort has been invested into minimizing the thermal conductance $G_2^*$. Bridge materials with poor thermal conductivity have been developed, but there are practical limits The time thermal constant responsible for AC attenuation is minimized by minimizing $C_1^*/[G_{D1}+G_2^*]$, and this is accomplished by making $C_1^*$ the absorber's mass very small. However, $C_1^*$ cannot be made arbitrarily small because it inversely impacts: absorption, pixel fill factor, and thermal noise temperature level. Below, we develop expressions for maximum signal and minimum noise which are given in terms of $G_{D1}$, $G_2^*$, and $C_1^*$.

Signal analysis is performed in the temperature domain because LWIR bolometers' signals are based on temperature changes. Correspondingly, noise is also represented as the temperature variance at the absorber 10. Several noise sources contribute to the total temperature variance at the absorber 10, and they are: (1) variance in the scene's photon power absorbed by the absorber 10, $\delta Q_R^2$, (2) variance in the photon power emitted by the absorber 10, $\delta Q_{D1}^2$, (3) variance in the radiation shield's photon power absorbed by the absorber 10, $\delta Q_{S1}^2$, (4) variance in the thermal bath temperature, $\delta T_{HB}^2$, and (5) variance in the absorber's temperature produced by noise in readout electronics, $\delta T_{EL}^2$.

Scene's photon flux fluctuations increase the absorber's temperature variance. Ultimately, the bolometers sensitivity, expressed in noise equivalent temperature resolution (NE$\Delta$T), is limited by this temperature variance. The minimum noise level in the scene's signal $Q_R$ is obtained from the variance in the signal's noise power spectral density $\delta Q_R^2$ arriving at the absorber element 10, and it is given by:

$$\delta Q_R^2 = \frac{8 A_D \sigma k_B T_S^5 \Delta f}{4 F^2} \tag{4}$$

where, $\Delta f$ represents the absorber's electrical frequency bandwidth, $k_B$ is Boltzmann's constant, and $\sigma$ is the Stefan-Boltzmann constant. The $4F^2$ factor attenuates the signal flux at the absorber in accordance to the solid angle define by the optics F#. The signal's noise power spectral density $\delta Q_R^2$ is readily translated into a temperature variance at the absorber 10, $\delta T_S^2$, by combining Equations (3) and (4) and integrating over frequency. The temperature variance $\delta T_S^2$ at the absorber 10 from the scene's variance $\delta Q_R^2$ is given by:

$$\delta T_S^2 = \frac{2}{\pi F^2} \int_0^\infty \frac{A_D \sigma k_B T_S^5}{[G_{D1}+G_2^*]^2 + \omega^2 [C_1^*]^2} d\omega \tag{5}$$

$$= \frac{G_R}{(G_{D1}+G_2^*)} \cdot \frac{k_B T_S^2}{C_1^*}$$

Equation (5) reveals that the temperature variance, induced by the scene 8 on the absorber element 10, is a product of two factors. The first factor is a conductance ratio: the conductance through free space between the scene 8 and the absorber 10, divided by the conductance between the absorber 10 and its surroundings $G_R/[G_{D1}+G_2^*]$. The second factor is the thermodynamic temperature variance for any object at temperature $T_S$ and with a heat capacity $C_1^*$. For best performance, the scene's noise should dominate over all other noise sources. This is facilitated with fast optics (small F#) and minimum conductance [$G_{D1}+G_2^*$], or excellent thermal isolation. The scene's temperature variance at the absorber 10 is increased by additional sources and these are considered next.

The temperature variance [$\delta T_1^2$] at the absorber has several thermal contributors, which include the absorber 10 itself, the heat bath 14, and radiative shields (not shown). In addition, electronic noise indirectly increases the absorber's temperature variance. The largest direct thermal contributor to the absorber's thermal variance is the absorber and this contribution is given as an integral of the power spectral temperature variance density [$\delta T_1^2(\omega)$] at the absorber by, $$\delta T_1^2 = \frac{1}{2\pi} \int_0^\infty \delta T_1^2(\omega) d\omega \tag{6}$$

$$= \frac{1}{2\pi} \int_0^\infty \frac{4 k_B T_1^2 G_2^*}{[G_2^* + G_{D1}]^2 + [\omega C_1^*]^2} d\omega$$

$$= \frac{G_2^*}{G_2^* + G_{D1}} \frac{k_B T_1^2}{C_1^*}$$

The absorber temperature variance, $\delta T_1^2$, is a product of two factors: a leading factor [$G_2^*$]/[$G_{D1}+G_2^*$] is equal almost to unity. The second factor represents the theoretical temperature variance of an object at temperature $T_1$ and with a heat capacity of $C_1^*$. When fluctuations from the lens and radiation shields are included, the leading factor becomes unity. The contributions from the heat bath are made small by increasing the heat bath's heat capacity. Hence, the only remaining contributor to the temperature variance at the absorber is electronic noise.

Electronic noise degrades the bolometer's sensitivity. The electronic noise analysis assumes the most mature and most widely used bolometers: resistive VOx bolometers. Thus, the electronic noise includes the readout voltage noise and noise voltage from the resistive bolometer, biased with a current $I_{CR}$. The total electronic noise voltage is converted to a temperature variance $[\delta T_{EL}^2]$ by dividing it by $[I_{CR} \partial R_{CB}/\partial T_S]^2$, where $\partial R_{CB}/\partial T_S$ is the resistive temperature coefficient, $I_{CR}$ is the bias current during readout, and $R_{CB}$ the absorber's resistance. The total electrical noise is a sum of the absorber's and amplifier's noise power spectral densities, and these are represented by white and 1/f noise terms $dE_N^2/df$ and $dE_{NA}^2/df$, respectively. Integrating these noise terms over radial frequency provides an expression for the equivalent temperature variance produced by the electronic noise voltage given by:

$$\delta T_{EL}^2 = \left[ I_{CR} \frac{\partial R_{CB}}{\partial T_S} \right]^{-2} \left[ \frac{dE_N^2/df}{4 C_E R_{CB}} + \int_{\omega_{LO}}^{\omega_{EL}} \frac{dE_{NA}^2}{df} \frac{d\omega}{2\pi} \right] \quad (7)$$

The temperature variance at the absorber due to electronic noise is a sum of two noise terms, multiplied by a factor $[I_{CR} \partial R_{CB}/\partial T_S]^{-2}$. The two terms are the integrated white noise and 1/f noise integral from the cut-on radial frequency $\omega_{LO}$ to the cut-off radial frequency $\omega_{EL}=1/C_E R_{CB}$. Minimum noise requires that the factor $[I_{CR} \partial R_{CB}/\partial T_S]^{-2}$ is minimized. Selection of absorbers with a high temperature coefficient $\partial R_{CB}/\partial T_S$ is important. Second, use of a larger readout current $I_{CR}$ helps, but it creates problems. Larger $I_{CR}$ currents inject $I^2 R$ power into the absorber that is larger (>1000X) that the signal power resolution (in the pWatts range). The work around large $I^2 R$ power is to use a pulsed readout to minimize the current heating duty cycle. However, pulsed operation requires wider signal bandwidth, accompanied with more noise. In the analysis it was assumed that the readout amplifiers voltage noise is less than the absorber's electrical noise. Such is facilitated with absorbers that have a large resistance, typically greater than 10KΩ. The ideal white noise power spectral density voltage equals to 12.9 nV/Hz$^{1/2}$. The 1/f noise power contributions diverge logarithmically with the low cut-on radial frequency $\omega_{LO}$. For the purpose of simplification, 1/f noise contribution is included by increasing the white noise value from 12.9 nV/Hz$^{1/2}$ to 0.1 μV/Hz$^{1/2}$. The absorber's total temperature variance $\delta T_T^2$ is approximated by the sum of Equations (5), (6), and (7), and is given by, $$\delta T_T^2 = \left( \frac{k_B T_S^2}{C_1^*} \right) \left[ \frac{G_R}{G_{D1}+G_2^*} + \frac{T_1^2}{T_S^2} + \frac{C_1^*}{k_B T_S^2} \left( I_{CR} \frac{\partial R_{CB}}{\partial T_S} \right)^{-2} \frac{0.25}{C_E R_{CB}} \frac{dE_N^2}{df} \right] \quad (8)$$

The total temperature variance $\delta T_T^2$ reveals how the bolometers sensitivity is affected. The leading factor is the minimum possible thermodynamic temperature variance, governed by scene temperature and the absorber's heat capacity. The second factor shows how this variance is increased by the thermal conductivity between the absorber and its environment relative to thermal conductivity with the scene. This factor reveals that poor thermal isolation lead to sensitivity degradation that cannot be overcome by better electronics or responsivity. This factor is a sum of there terms representing contributions, respectively, from the scene's thermal noise, the absorber's thermal noise, and the electronics' thermal noise. The values of second term is significantly greater than the scene's radiation noise and electronics noise can only further degrade sensitivity, and this is calculated next in terms of NEΔT.

The bolometer's sensitivity (minimum resolvable temperature: NEΔT) is defined at unity signal to noise ratio. The equation for NEΔT is obtained equating the change in absorber's temperature (given by Equation (3)) to the total noise temperature fluctuations at the absorber (given by the square root of Equation (8)). At unity signal to noise ratio, NEΔT equals $\delta T_S$, making this substitution and solving for NEΔT the following is obtained:

$$NE\Delta T = \qquad (9)$$
$$\sqrt{\frac{k_B T_S^2}{C_1^*}} \left[ \frac{G_2^*+G_{D1}}{G_R} + \left( \frac{G_2^*+G_{D1}}{G_R} \right)^2 \left( \frac{T_1^2}{T_S^2} + \frac{C_1^*}{k_B T_S^2} \frac{\frac{\omega_{EL}}{4} dE_N^2/df}{(I_{CR} \partial R_{CB}/\partial T_S)^2} \right) \right]^{1/2}$$
$$\left( 1 + \frac{\omega^2}{\omega_{TM}^2} \right)^{1/2}$$

This Equation has been condensed by defining $\omega_{TM}=[G_{D1}+G_2^*]/C_1^*$ and $\omega_{EL}=1/R_E C_{CB}$. NEΔT is given as a product of three factors. Maximum sensitivity (smallest NEΔT) is achieved by minimizing each one of these factors.

The first factor represents the thermodynamic sensitivity limit dictated by the absorber's heat capacity $C_1^*$ and scene's temperature $T_S$. The actual sensitivity can only get worse than this theoretical thermodynamic limit The second in the square brackets is a sum of three terms beginning with $[G_2^*+G_{D1}]/G_R$, which represents the sensitivity degradation due to thermal loading $[G_{D1}+G_2^*]$ on the absorber relative to the thermal conductance to the scene $G_R$. This factor is typically greater than 10 and much effort has gone into minimizing it because the sensitivity degradation it produces cannot be undone. The degradation to thermal loading can be minimized with maximizing $G_R$ [with fast optics], and minimizing $[G_{D1}+G_2^*]$ by construing thermal isolation bridges with poor thermal conductivity. Thermal loading has an additional deleterious impact because it also decreases the signal thereby making things more susceptible to electronic readout noise. The second term, in the square brackets, incorporates all the thermal noise contributions from the absorber element [including radiation shields]. Heat bath noise is not included since it can be made arbitrarily small by increasing the heat bath's heat capacity. Thus the second term is much larger than the leading term. The last term is in the square bracket represents readout electronics' noise. Electronics noise can only make things worse and it can be minimized by maximizing the responsivity $\partial R_{CB}/\partial T_S$. Optimistically, let's assume that the noise from the resistive bolometer dominates over all electronic noises. For a $10^4 \Omega$ resistive bolometer, the noise $dE_N^2/df$ is about $2\times10^{-16} V^2/Hz$. 1/f noise will only makes things worse. The bolometer's TCR, equals to $\partial R_{CB}/\partial T_S \approx 200\Omega/°K$ and lets make $G_2^*/G_{D1} \approx 10$. For: $T_S \approx 300°K$, $A_D = 0.25 \times 10^{-4}$ cm$^2$, and F=1; the third term in the sum in Equation (9) equals to $\omega_{EL} 3\times10^{-10}/I_{CR}^2$. The electronic noise should be significantly less than the second term in the sum, [equals <10]. If $(\omega_{EL})=30$, the electronics noise becomes insignificant if the circuit current $I_{CR} >> 0.01$ mA, or $I_{CR} > 0.03$ mA. The $I^2 R$ power associated with $I_{CR} > 0.03$ mA is about 10 μWatts, and this is much larger than the desired power resolution of about 10 pWatts. This large $I^2 R$ readout power is about a million times larger than the desired sensitivity thereby imposing unreasonable temperature sensitivity. The $I^2 R$ power can be minimized by minimizing the $I_{CR}$ duty cycle. For a 400×500 elements staring array, the current on time [or $I^2 R$ power] can be reduced by up to $2\times10^5$ times by minimizing the $I_{CR}$ duty cycle. However, a minimum duty cycle maximizes the operating bandwidth given by $\omega_{EL}$, and this increases noise. The larger noise can be attenuated by increasing $I_{CR}$ from 0.03 mA to about 12 mA. Unfortunately, this increases the $I^2R$ readout power by about $10^5$, an unacceptable situation. Including 1/f noise makes things even more difficult. Parallel readout can be used to reduce electronic bandwidth, but it will increase the power by the number of parallel channels.

The third factor reveals how sensitivity decreases with frequency $\omega_{TM}=[G_{D1}+G_2^*]/C_1^*$. The optimal solution for this factor is to minimize the frequency response $\omega_{TM}$, and this is achieved by making $\omega_{TM}$ equal the video frame rate of 30 Hz. These limitations addressed by the active thermal isolation USSS approach described next.

According to Equation (9), thermal loading reduces the NEΔT sensitivity by at least $[G_{D1}+G_2^*]/G_R$. The responsivity is reduced by $[G_R/(G_{D1}+G_2^*)]$, see Equation (3). The values of $G_{D1}$ and $G_R$ are limited by optics, and the most direct way for improvement is by minimizing the thermal conductivity $G_2^* \approx 2 \times 10^{-7}$ Watts/° K to approach $G_{D1}$, and $G_R$. Given inherent limitations with material and geometrical approaches, further reductions in $G_2^*$ required a different approach. The approach, incorporated in the all silicon ultra sensitive silicon sensor (USSS), is to utilize electro-thermal feedback to substantially reduce the effective thermal conductivity of $G_2^*$. Electro-thermal feedback offers active, as opposed to passive, thermal isolation and thereby obtain a ten-fold improvement in the thermal isolation. Improved thermal isolation results in increases in photo-responsivity and corresponding improvements in NEΔT. The performance advantages of the USSS approach are detailed in the description of the operation and the structure of a single USSS pixel.

Active thermal isolation, mechanized with electro-thermal feedback, can significantly improve thermal isolation between the absorber element 10 and heat bath 14 in FIG. 1. Thermal isolation improvements with active techniques versus passive techniques directly lead to corresponding improvement in responsivity, and sensitivity. These improvements are shown by analysis of the electro-thermal feedback.

Mechanizing electro-thermal feedback in each USSS pixel requires incorporation of special circuits and components. Specifically, electro-thermal feedback requires: (1) temperature difference sensors, (2) temperature difference amplifier, (3) a heater whose output power dependent on temperature difference, and (4) an approach that incorporates all these into a single pixel.

The USSS pixel approach in FIG. 3 shows a three-temperature-tier design for maximizing area efficiency. The three tier structure includes: an absorber 10 at the top tier at temperature $T_1$, an intermediate stage 16 in the middle at temperature $T_2$, and at the bottom a heat bath 14 at temperature $T_{HB}$. These tiers are mechanically and electrically connected by thermal isolation bridges $G_1^*$ and $G_2^*$.

Electro-thermal feedback requires two temperature sensors to control the power delivered into the intermediate stage 16 so that $T_2$ converges to $T_1$. Conventionally, the temperature difference signal is obtained from two silicon diodes 34 and 40, connected back-to-back (see FIG. 4). Temperature sensing diode 34 is built into the absorber 10 and a temperature sensing diode 40 is built into the intermediate stage 16. Conventionally, temperature sensing diodes 34 and 40 are biased with a constant current and the voltage is a function of temperature. The voltage signal from diodes 34 and 40, biased with a constant current, is about −2 m° K per degree Kelvin.

The voltage signal from the back-to-back diodes 34 and 40 is amplified and controls the temperature $T_2$ of the intermediate stage 16. In each pixel, a single voltage amplifier 18 functions as USSS pixel readout and as a heater with variable output power $Q_H$. Combining readout and heater functions facilitates pixel miniaturization. The power $Q_H$ delivered into the intermediate stage 16 depends on the temperature difference between $T_1$ and $T_2$. If $T_2 > T_1$ ($T_2 < T_1$) the quiescent power $Q_H$ delivered decreases (increases) thereby converging $T_2$ towards $T_1$. The potential across the back-to-back diodes 34 and 40 is amplified and produces an output voltage signal $V_S$. Relative to a dc level, the amplifier output $V_S$ will be positive if $T_2 > T_1$ and negative if $T_2 < T_1$. As $V_S$ increases, the quiescent power $Q_H$ delivered by the amplifier to the intermediate stage 16 decreases. Conversely, as $V_S$ decreases, the quiescent power $Q_H$ delivered by the amplifier to the intermediate stage 16 increases. The power $Q_H$ delivered by the amplifier to the intermediate stage 16 is given by, $$Q_H = I_H B^+ - I_H V_s = I_H B^+ - I_H A_G [\Delta\Phi_{D1}(T_1) - \Delta\Phi_{D2}(T_2)] \tag{10}$$

where $A_G$ is the amplifier's voltage gain and $I_H$ is the dc bias current flowing between B+ and ground.

The amplifier's voltage gain is typically greater than $10^4$, $I_H$ is about 1 μA, and B+ is about 10 volts. Since B+ and $I_H$ are constants, the amplifier's quiescent power $Q_H$ heating the intermediate stage varies linearly with the output signal $V_S$, and it becomes a measure of the power received by the absorber. Specifically, as $V_S$ decreases (increases) the power delivered by the amplifier increases (decreases). The differential power delivered by the amplifier depends on temperature difference and is readily computed from Equation (10) and given by, $$\delta Q_H = -I_H A_G \left[ \frac{\partial(\Delta\Phi_{D1}(T_1))}{\partial T_1} \delta T_1 - \frac{\partial(\Delta\Phi_{D2}(T_2))}{\partial T_2} \delta T_2 \right] \approx \tag{11}$$
$$-I_H A_G \frac{\partial(\Delta\Phi_{D1}(T_1))}{\partial T_1} [\delta T_1 - \delta T_2]$$

where $\partial[\Delta\Phi_{D1}(T_1)]/\partial T_1 \approx \partial[\Delta\Phi_{D2}(T_2)]/\partial T_2$ represents the sensitivity of the temperature sensing diodes (for current biased p/n diodes it is about −2mV/° K).

The electro-thermal coefficient "A" depends on the USSS heater power in FIG. 3 and is given by, $$A \approx -I_H A_G \left[ \frac{\partial(\Delta\Phi_{D1}(T_1))}{\partial T_1} \right] \approx -I_H A_G \left[ \frac{\partial(\Delta\Phi_{D2}(T_2))}{\partial T_2} \right] \tag{12}$$

The value of "A" depends on the voltage amplifier's gain and frequency response. The amplifier's voltage gain is $A_G = A_0/(1+j\omega/\omega_0)$ with $\omega_0 \approx 10^4$ rad/sec and $A_0 \approx 10^4$. For $\partial[\Delta\Phi_{D2}(T_2)]/\partial T_2 - 2$ mV/° K, and $I_H \approx 2$ μA, the value of the electro-thermal coefficient is given by $A \approx 4 \times 10^{-5}/(1+j\omega/\omega_0)$ W/° K. For proper operation, analysis shows that the electro-thermal coefficient "A" must be large relative to conductances $G_1^*$ and $G_2^*$, which are about $10^{-7}$ W/° K.

The USSS (see FIG. 3) photoresponse is computed with thermal analysis of the USSS thermal equivalent circuit shown in FIG. 5. The USSS analysis follows the approach presented for conventional bolometers. For bidirectional temperature tracking, $T_{HB}$ is always less than $T_1$ and $T_2$. As anticipated, thermal analysis reveals that the conductance of $G_1^*$ is severely reduced by electro-thermal feedback. This reduction produces greater than a ten-fold improvement in thermal isolation and increase in photoresponse. The thermal balance conditions at the absorber 10 and intermediate stages 16 are expressed in terms of two integral/differential equations. At the absorber stage 10, the thermal balance equation is given by:

$$Q_R - Q_{D1} + Q_{S1} = -\int_{T_1}^{T_2} G_1(T)dT + \int_{T_1}^{T_1+\delta T_1} j\omega C_1(T)dT = \quad (13)$$

$$\sum_{n=0}^{\infty}\left(-\frac{\partial^n G_1(T)}{\partial T^n}\bigg|_{T_1}\frac{(T_2-T_1)^{n+1}}{(n+1)!} + j\omega\frac{\partial^n C_1(T)}{\partial T^n}\bigg|_{T_1}\frac{(\delta T_1)^{n+1}}{(n+1)!}\right)$$

For small temperature signals $G_1(T)$ and $C_1(T)$, the integrals in Equation (13) can be approximated by the first two terms of the Taylor series, and the temperature differential of Equation (13) yields an expression given by:

$$G_R\delta T_S = \lfloor G_1{}^* + G_{D1il} \; j\omega C_1{}^* \rfloor \delta T_1 - G_1{}^*\delta T_2 \quad (14)$$

where, $G_1{}^* = G_1 + (T_2-T_1)\partial G_1/\partial T_1$.

Similarly, thermal balance conditions at the intermediate stage 16 give rise to a differential/integral equation given by:

$$-Q_{D2} + Q_H + Q_{S2} = \quad (15)$$

$$-\int_{T_2}^{T_{HB}} G_2(T)dT \int_{T_2}^{T_2+\delta T_2} j\omega C_2(T)dT + \int_{T_1}^{T_2} G_1(T)dT =$$

$$\sum_{n=0}^{\infty}\left[\left(-\frac{\partial^n G_2(T)}{\partial T^n}\bigg|_{T_2}\frac{(T_{HB}-T_2)^{n+1}}{(n+1)!} + j\omega\frac{\partial^n C_2(T)}{\partial T^n}\bigg|_{T_2}\frac{(\delta T_2)^{n+1}}{(n+1)!}\right)\right] +$$

$$\sum_{n=0}^{\infty}\left[\frac{\partial^n G_1(T)}{\partial T^n}\bigg|_{T_1}\frac{(T_2-T_1)^{n+1}}{(n+1)!}\right]$$

For small temperature signal $G_1(T)$ and $C_1(T)$ dependent weakly on temperature, the integrals are approximated by the first two Taylor series terms. Taking the temperature differential of Equation (15) and combining with Equations (11) and (12), we obtained:

$$\lfloor G_1{}^*A\rfloor\delta T_1 = \lfloor G_1{}^* + G_2{}^* + G_{D2} + A + j\omega C_2{}^*\rfloor\delta T_2 \quad (16)$$

Variable $G_2{}^*$ is defined as: $G_2{}^* = G_2 + (T_{HB}-T_2)\partial G_2/\partial T_2$. For sufficiently large $A >> [G_1{}^*, G_2{}^*, G^*{}_{D2}]$, Equation (16) shows that electro-thermal feedback forces $\delta T_1 \approx \delta T_2$. This condition minimizes change in the thermal current through G: with changes in absorber's temperature $T_1$. Having the intermediate stage 16 track the absorber's temperature effectively makes $G_1{}^*$ behave as a much smaller thermal conductance. In the limit as A goes to infinity $\delta T_1 = \delta T_2$, and the absorber's thermal isolation should approach the ideal radiative limit $G_{D1}$.

Responsivity also improves because electro-thermal feedback greatly improves the effective thermal isolation. This improvement is revealed by combining Equations (14) with (16) to eliminate $T_2$, and obtaining an expression for $T_1$ as a function of $T_S$, specifically:

$$\delta T_1 = \frac{G_R}{\left[G_{D1}+j\omega C_1^* + \frac{G_1^*[G_2^*+G_{D2}+j\omega C_2^*]}{[G_1^*+G_2^*+G_{D2}+A+j\omega C_2]}\right]}\delta T_S \cong \quad (17)$$

$$\frac{G_R/G_{D1}}{\left[1+\frac{j\omega C_1^*}{G_{D1}}\right]}\delta T_S$$

Comparing Equations (17) and (3) reveals that with large electro-thermal values $A >> [G_1{}^*, G_2{}^*, G_{D2}]$ the responsivity increases. The electro-thermal coefficient $A \approx 4\times 10^{-5}/(1+\omega/\omega_0)$W/° K is much larger than typical values for $G_1{}^* \approx G_2{}^* \approx 2\times 10^{-7}$W/° K, and the result is that electro-thermal feedback reduces conductance $G_1{}^*$ to about $G_{D1}$. This reduction represents better than a 40 fold decrease in the effective thermal conductance of $G_{D1}$. The improved responsivity is limited by the optical solid angle, and, according to Equation (17), is approximated by: $\delta T_1/\delta T_S = 1/(4F^2)$. With greatly improved photoresponsivity (X40), susceptibility to absorber stage noise and readout circuit noise are reduced thereby facilitating an improved NE$\Delta$T.

The USSS voltage photoresponse is calculated in several steps, starting by substituting Equation (10) for $Q_H$ into Equation (15) and taking the differential. Under the constant bias current $I_H$, the differential power delivered by the amplifier is simply $\delta Q_H = -\delta V_S I_H$. Incorporating this into the differential of Equation (15), and after some rearrangements, a new equation is obtained given by, $$\delta V_S I_H = G_1{}^*\delta T_1 - \lfloor G_1{}^* + G_2{}^* + G_{D2} + j\omega C_2\rfloor \delta T_2 \quad (18)$$

The voltage responsivity in terms of changes in scene temperature $\delta T_S$ is obtained by first using Equation (16) to factor $\delta T_2$ from Equation (18) and from the result factoring $\delta T_1$ with Equation (17). Performing these substitutions, and after some rearrangements, the USSS's voltage responsivity is given by, $$\frac{\delta V_S(\omega)}{\delta T_S(\omega)} = \frac{-AG_R/I_H}{\left[\frac{1+(G_1^*+A)/}{(G_2^*+G_{D2}+j\omega C_2)}\right][G_{D1}+j\omega C_1]+G_1^*} \approx \quad (19)$$

$$-\left(\frac{G_2^*+G_{D2}}{I_H}\right)\left(\frac{G_R}{G_{D1}}\right)\frac{[1+j\omega C_2/(G_2^*+G_{D2})]}{[1+j\omega C_1/G_{D1}]} \text{ Volts/Kelvin}$$

The approximations to the right side of Equation (19) are obtained with $A >> [G_1{}^*, G_2{}^*, G_{D2}]$, and A is defined by Equation (12). The responsivity approximation equals about $(0.25/F^2)(G_2{}^*/I_H) \approx 0.025$V/° K: when $I_H = 2$ µA, $G_{D1}/G_R = 4F^2 = 0.25$ and $G_2{}^* \approx 2\times 10^{-7}$W/° K. Thus, by having made $A_0$ very large, the absorber element's dc response greatly increases and produces a signal sufficiently large to diminish the impact of electronics noise. There are two ac time constants, the first one is from the absorber element and is given as $C_1/G_{D1}$, and the second is for the intermediate stage and it is given by $C_2/(G_2{}^*+G_{D1})$. For television frame rates, the bolometer time constant is required to be consistent with 30Hz frame rate, or $C_1/G_{D1} = 1/(60\pi)$. The thermal time constant is minimized by using concentrators such as microlenses or microantennas. The concentrators will reduce further the value of $G_{D1}$ to provide even better responsivity. The projected sensitivity improvements with the USSS are examined next.

The USSS model includes conventional thermal noise source and the electronic/thermal noise from electro-thermal feedback. The thermal noise sources include fluctuations in: the scene's flux, $Q_S$, the radiation shields, $Q_{S1}$ and $Q_{S2}$, the heat bath coupled through conductance $G_1{}^*$ and $G_2{}^*$, the absorber element, $Q_{D1}$, the intermediate stage, $Q_{D2}$, and electro-thermal feedback noise is categorized as electronic readout noise. These noise sources manifest themselves as a fluctuation in the output voltage signal $V_S$. Specifically, noise voltage fluctuations, produced by temperature fluctuations include: (1) the scene, $\delta V_S(T_S)$, (2) the heat bath, $\delta V_S(T_{HB})$, (3) the absorber stage, $\delta V_S(T_1)$, (4) the intermediate stage, $\delta V_S(T_2)$, and electro-thermal/readout circuits noise voltage, $\delta V_S(EL)$. These noise sources are addressed next.

Spectral fluctuations in the scene temperature, $\delta T_S{}^2(\omega)/d\omega = 4kT_S{}^2 G_R$, contributes RMS noise to the USSS output node $\delta V_S(T_S)$. This contribution is computed by integrating the scene fluctuations times the squared absolute value of the transfer function given by Equation (19). Approximating Equation (19) at high frequency, the RMS voltage noise due to the spectral temperature fluctuations in the scene temperature $T_S(\omega)$ is:

$$\delta V_S(T_S) \cong \left[\frac{G_2^* + G_{D2}}{I_H}\right] \qquad (20)$$

$$\sqrt{\frac{1}{2\pi}\int_0^\infty \frac{4kT_S^2 G_R d\omega}{|G_{D1} + j\omega C_1^*|^2}} \cong \left[\frac{G_2^* + G_{D2}}{I_H}\right]\left(\frac{G_R}{G_{D1}}\right)^{1/2}\left(\frac{kT_S^2}{C_1^*}\right)^{1/2}$$

Contributions from fluctuations in the heat bath's temperature to the output node voltage noise $\delta V_S(T_{HB})$ is calculated in terms of temperature fluctuations induced on the absorber's temperature $T_1$ and the intermediate stage's temperature $T_2$. These relationships are obtained by taking the differentials of Equations (13) and (15) under the conditions that $\delta T_{HB} \neq 0$ and $\delta T_S = 0$. Taking differentials of Equations (13), and (15), the following is obtained:

$$\lfloor G_{S1} + j\omega C_{HB} \rfloor \delta T_{HB}(\omega) + \lfloor G_1^* \rfloor \delta T_2(\omega) = \lfloor G_1^* + G_{D1} + j\omega C_1^* \rfloor \delta T_1(\omega) \qquad (21)$$

$$\lfloor G_2^* + G_{S2} + j\omega C_{HB} \rfloor \delta T_{HB}(\omega) + \lfloor G_1^* + A \rfloor \delta T_1(\omega) = \lfloor G_1^* + G_2^* + G_{D2} + A + j\omega C_2^* \rfloor \delta T_2(\omega) \qquad (22)$$

An expression for $\delta V_S(\omega)$ in terms of $\delta T_{HB}(\omega)$ is obtained by combining Equations (21), (22), (10), and (12). This expression is simplified with approximations that are $G_{S2} \approx G_{S1}$, and $G_{D2} \approx G_{D1} = G_{S2} \approx G_{S1}$, and $C_2^* \approx C_1$. Combing all these yields a transfer function relating the output voltage to changes in the heat bath temperature, and it is given by, $$\delta V_S(\omega) = \frac{G_2^* + G_{D2}}{I_H}\left[\frac{(-Aj\omega C_{HB}\delta T_{HB}(\omega))}{(G_1^* + A)(G_{D1} + j\omega C_1^*) + (G_2^* + G_{D2} + j\omega C_2^*)(G_1^* + G_{D1} + j\omega C_1^*)}\right] \qquad (23)$$

The RMS noise level is computed with the definition of the noise power spectral density, and of the transfer function given by Equation (23). Converting Equation (23) into a power spectral density, the RMS noise voltage due to thermal fluctuations in the heat bath temperature become, $$\delta V_S(T_{HB}) \cong \qquad (24)$$

$$\frac{G_2^* + G_{D2}}{I_H}\sqrt{\int_0^\infty \frac{[d\omega/2\pi]\omega^2 C_{HB}^2 4G_{D1}kT_{HB}^2/(G_{D1}^2 + \omega^2 C_{HB}^2)}{\left|(G_{D1} + j\omega C_1^*) + \frac{(G_1^* + G_{D1} + j\omega C_1^*)}{A}\right|\frac{(G_2^* + G_{D2} + j\omega C_2^*)^2}{}}} \cong$$

$$\frac{G_2^* + G_{D2}}{I_H}\sqrt{\frac{kT_{HB}^2}{C_1^*}}$$

We've simplified Equation (24) by recognizing that at higher frequencies the integral is simplified because $G_{D1} \ll \omega^2 C_{HB}^2$, and the electro-thermal coefficient $A \gg [G_1^* + G_2^* + G_{D2}]$. The right side of Equation (24) is obtained by including the fact that $(A + G_1^* + G_2^* + G_{D2})C_1^* \gg G_{D1}C_2$.

The noise voltage $\delta V_S(T_1)$ due to fluctuations in the absorber's temperature $\delta T_1(\omega)$ is calculated using the equivalent circuit in FIG. 6, when $\delta Q_2 = \delta Q_H = 0$. Summing the flow of all the thermal power at node $T_1$, we obtain:

$$\delta Q_1(\omega) = (G_1^* + G_{D1} + j\omega C_1^*)\delta T_1(\omega) - G_1^* \delta T_2(\omega) \qquad (25)$$

$$= \left[G_{D1} + j\omega C_1^* + \frac{G_1^*(G_2^* + G_{D2} + j\omega C_2^*)}{(G_1^* + G_2^* + G_{D2} + A + j\omega C_2^*)}\right]\delta T_1(\omega)$$

$\delta Q_1$ squared equals to the squared power spectral density and it is given by $dQ^2_1/df = 4G_{D1}k_B(T_1)^2$. Using Equation (16), $\delta T_2(\omega)$ is eliminated to yield the right side of Equation (25). Combining the right side of Equation (11) with Equation (12) and using Equation (16) to eliminate $\delta T_2(\omega)$, the spectral noise voltage $\delta V_S[T_1(\omega)]$ produced by temperature fluctuations $\delta T_1(\omega)$ is obtained and is given by, $$-\delta V_S[T_1(\omega)]I_H = A\left[1 - \frac{\delta T_2(\omega)}{\delta T_1(\omega)}\right]\delta T_1(\omega) \qquad (26)$$

$$= A\left[\frac{G_2^* + G_{D2} + j\omega C_2^*}{G_1^* + G_2^* + G_{D2} + A + j\omega C_2^*}\right]\delta T_1(\omega)$$

Solving Equation (25) for $\delta T_1(\omega)$ and using it to eliminate $\delta T_1(107)$ from Equation (26), an analytical solution is obtained relating the spectral noise voltage $\delta V_S[T_1(107)]$ to fluctuations in the noise power $\delta Q_1$. Squaring the absolute value of this solution, replacing $\delta Q_1$ by $dQ^2_1/df = 4G_{D1}k_B(T_1)^2$, integrating $[0 \leq \omega \leq \infty]$, and taking the square root, the RMS voltage fluctuations $\delta V_S(T_1)$, produced by $\delta T_1(\omega)$, is obtained and it is given by:

$$\delta V_S(T_1) = \qquad (27)$$

$$\frac{1}{I_H}\sqrt{\int_0^\infty \frac{2AG_{D1}k_BT_1^2 d\omega/\pi}{\left|G_1^* + G_{D1} + j\omega C_1^* + [(1+A)G_{D1} + j\omega C_1^*]/[G_2^* + G_{D2} + j\omega C_2^*]\right|^2}} =$$

$$\frac{G_2^* + G_{D2}}{I_H}\left[\frac{k_BT_1^2}{C_1^*}\right]^{1/2}$$

Temperature fluctuations in the intermediate stage $\delta T_2(\omega)$ produce noise voltage at the output node and this contribution is calculated as contributions from the absorber stage $\delta T_1(107)$. Using the equivalent circuit in FIG. 6, the power at node $T_1$ is summed when $\delta Q_1 = \delta Q_H = 0$, and a relationship between $\delta T_1(\omega)$ and $\delta T_2(\omega)$ is obtained and given by:

$$\delta T_1(\omega) = \lfloor G_1^*/(G_1^* + G_{D2} + j\omega C_1^*) \rfloor \delta T_2(\omega) \qquad (28)$$

The intermediate stage noise source $\delta Q_2$, produces temperature fluctuations $\delta T_2(\omega)$, hence $|T_2| > |T_1|$, and this is given by Equation (28). Summing the power at node $T_2$ in FIG. 6, a spectral power relationship given by the following is obtained:

$$\delta Q_2(\omega) + \delta Q_H(\omega) = \lfloor G_1^* + G_2^* + G_{D2} + j\omega C_2^* \rfloor \delta T_2(\omega) - G_1^* \delta T_1(\omega) \qquad (29)$$

The variables $\delta Q_H$ and $\delta T_1$ in Equation (29) are eliminated with $\delta Q_H = A[\delta T_1 - \delta T_2]$, and Equation (28), respectively, to obtain:

$$\delta Q_2(\omega) = \lfloor (G_2^* + G_{D2} + j\omega C_2^*) + (A + G_1^*)(G_{D1} + j\omega C_1^*)/(G_1^* + G_{D1} + j\omega C_1^*) \rfloor \delta T_2(107) \qquad (30)$$

Using Equations (11) and (28), an expression is obtained for the spectral fluctuations in the output voltage $V_S[T_2(\omega)]$ produced by thermal fluctuations from the intermediate stage and it is given by:

$$-\delta V_S[T_2(\omega)]I_H = A[1-\delta T_1(\omega)]\delta T_2(\omega) = -A(G_{D1}+j\omega C_1^*)(G_1^*+G_{D1}+j\omega C_1^*)\delta T_2(\omega) \quad (31)$$

Fluctuations $\delta Q_2$ squared is given in terms of black body radiation by $dQ^2{}_2/df=4G_{D2}k_B(T_2)^2$. Combining Equations (30) and (31), to eliminate $\delta T_2(\omega)$, and taking the absolute value, squared, integrating $[0 \leq \omega \leq \infty]$, and taking the square root yields the voltage fluctuations at node $T_2$ in terms of the intermediate stage's temperature given by, $$\delta V_S(T_2) = \quad (32)$$

$$\frac{1}{I_H}\sqrt{\int_0^\infty \frac{2G_{D2}k_B T_2^2 d\omega/\pi}{\left|1+\frac{G_1^*}{A}+\frac{(G_1^*+G_{D1}+j\omega C_1^*)}{A(G_{D1}+j\omega C_1^*)}\right|^2 (G_2^*+G_{D2}+j\omega C_2^*)^2}} = \frac{G_2^*+G_{D2}}{I_H}\left[\frac{k_B T_2^2}{C_2^*}\right]$$

Equation (32) is simplified by recognizing that for large "A" the approximation on the right is obtained and it reveals that the voltage fluctuations are proportional to the classical temperature fluctuations of a black body at temperature $T_2$. The factor in front is the total thermal conductivity from the intermediate stage divided by the amplifier's bias current $I_H$. The total fluctuation in voltage $V_S$ from fluctuations in temperatures is the RMS sum of fluctuations from $T_{HB}$, $T_S$, $T_1$ and $T_2$.

Electrical noise from the R/O and electro-thermal feedback circuit corrupts the USSS output signal. The level of corruption has been previously computed, and is given in terms of the amplifier's noise current, the conductivity of the thermal bridges, and amplifier's bias current $I_H$. The contribution of electrical noise took into account the affects of electro-thermal feedback and electrical feedback. In the analysis below, the amplifier's effective channel noise $I_{N0}$ without any feedback is defined. Noise analysis is performed by representing noise as a Fourier series sum, and analyzing the contribution of each term. Including electrical and thermal feedback, the electrical voltage noise is given by, $$\delta V_S[E_L(\omega)] = \frac{Z_S I_{N0}(\omega)}{1+\frac{g_m Z_S Z_D}{(Z_S+Z_G+Z_D)}-\left[\frac{\left[\frac{g_m Z_S Z_G}{Z_S+Z_G+Z_D}\right]I_H \frac{\partial E_F(T)}{\partial T}(G_{D1}+j\omega C_1^*)}{(G_2^*+G_{D2}+j\omega C_2^*)(G_1^*+G_{D1}+j\omega C_1^*)+G_1^*(G_{D1}+j\omega C_1^*)}\right]} \quad (33)$$

Affects of electrical feedback are represented by the first algebraic term in denominator, and affects of thermal feedback are represented by the second algebraic term in the denominator. The larger the denominator is the smaller is the noise. The negative sign in front of the thermal feedback term is cancelled when it is multiplied by the negative factor $\partial E_F(T)/\partial T \approx 2$ mV/° K. Noise attenuation produced by the electrical and thermal feedbacks terms is estimated in terms of thermal conductivities. Typically, $Z_G \gg [Z_D, Z_S]$, $g_m Z_S \gg 1$, $G_2^* \approx G_1^* > [10 G_{D1}, 10 G_{D2}]$. Additionally, the USSS operating conditions are given by: $I_H = 2$ µA, $\partial E_F(T)/\partial T \approx 2$ mV/° K, $[G_{D1}, G_{D2}] \approx 1.5 \times 10^{-8}$ W/° K, $g_m Z_S \approx 10^4$, and $[G_1^*, G_2^*] \approx 2 \times 10^{-7}$ W/° K. The value of the electro-thermal term $A \approx 4 \times 10^{-5}$ W/° K dominates over the other thermal conductivities.

Incorporating all these into Equation (33), a simplified expression is obtained, and it is given as, $$\delta V_S[E_L(\omega)] \cong \quad (34)$$

$$I_{N0}(\omega)Z_S\left[1+\frac{-g_m Z_S I_H \frac{\partial E_F(T)}{\partial T}(G_{D1}+j\omega C_1^*)}{(G_2^*+G_{D2}+j\omega C_2^*)(G_1^*+G_{D1}+j\omega C_1^*)}\right]^{-1} \cong$$

$$I_{N0}(\omega)Z_S\left[\frac{G_2^* G_1^*}{A G_{D1}}\right]$$

The right side of Equation (34) incorporates these approximations combined with $A=-I_H g_m Z_S \partial E_F(T)/\partial T$, given by Equation (12). For large electro-thermal feedback $(A \gg [G_1^*, G_2^*, $ and $G_{D1}]$ the noise is attenuated. The spectral noise density is readily converted into a standard deviation by integrating over frequency. If $1/f$ noise is neglected, the integral of Equation (34) is simplified and the noise voltage, in terms of the electrical bandwidth, $(\Delta_{BW})^{1/2}$, is given by:

$$\delta V_S(E_L) \leq I_{N0}(\omega)Z_S\left[\frac{G_2 G_1}{A G_{D1}}\right]\Delta_{BW}^{1/2} \quad (35)$$

The total noise at the USSS output node is the RMS sum of contributions from: the scene [Equation (20)], the heat bath [Equation (24)], the bolometer stage $T_1$ [Equation (27)], the intermediate stage $T_2$ [Equation (32)], and the readout electronics [Equation (35)]. The USSS sensitivity, $NE\Delta T_{USSS}$, or minimum resolvable temperature, is obtained by equating the total noise to the signal: unity signals to noise ratio. RMS summing Equations (20), (24), (27), (32), (35) and dividing it by the absolute value of right side of Equation (19) yields the expression for $NE\Delta T_{USSS}$, and it is given by, $$NE\Delta T_{USSB} \geq \quad (36)$$

$$\sqrt{\frac{k_B T_S^2}{C_1^*}}\left[\frac{\frac{G_{D1}}{G_R}+\left(\frac{G_{D1}}{G_R}\right)^2}{\left(\frac{T_{HB}}{T_S}\right)^2+\left(\frac{T_1}{T_S}\right)^2+\left(\frac{T_2}{T_S}\right)^2\left(\frac{C_1^*}{C_2^*}\right)^2}+\left(\frac{G_1^*}{G_R}\right)^2\left(\frac{C_1^*}{k_B T_S^2}\right)\left(\frac{I_{N0}Z_S I_H}{A}\right)^2\Delta_{BW}\right]^{1/2}\left[\frac{1+\left(\frac{\omega C_1^*}{G_{D1}}\right)^2}{1+\left(\frac{\omega C_2^*}{G_2^*+G_{D2}}\right)^2}\right]^{1/2}$$

The $NE\Delta T_{USSS}$ sensitivity in Equation (36) has been factored into three factors for comparison with the $NE\Delta T$ sensitivity of conventional bolometers given by Equation (9). Sensitivity comparisons are made on a term by terms basis.

The first factor $(kT_S^2/C_1^*)^{1/2}$ represents the theoretical thermal sensitivity limit for a body at temperature $T_S$ and heat capacity $C_1^*$. As expected, this factor is the same in Equations (9) and (36).

The second factor in the square brackets in Equation (36) is a sum of five terms with the upper terms corresponding to the first term in the square brackets in Equation (9). These terms show how sensitivity is reduced by thermal loading. With active thermal isolation, thermal loading is the USSS is much smaller than thermal loading in conventional bolometers: $[G_{D1}/G_R]^2 \ll [(G_{D1}+G_2^*)/G_R]^2$. This reduction in thermal loading and this leads to greater than 10X sensitivity improvement. The other thermal noise terms on the first line inside the square brackets in Equation (36) include radiation shield noise, absorber noise, and heat bath noise. These noise sources are multiplied by the factors, respectively, $[G_{D1}/G_R]^2$ and $[(G_{D1}+G_2^*)/G_R]^2$ in Equations (36) and (9). Clearly, thermal loading amplifies the affects of thermal noise from the absorber and radiation shields, and the multiplication is much worse (at least 10X) in conventional bolometers.

This affective noise "amplification" occurs because thermal loading attenuates the signal and not the thermal noise. In the NEΔT equations this attenuation manifests itself as though the noise increases. This "noise amplification" also applies to the electronics' readout noise and is apparent from comparing the second line inside the square brackets in Equation (36) with the last term inside the square brackets in Equation (9). The electronics' readout noise is smaller in the USSS compared to electronics' readout noise in conventional bolometers. This is readily confirmed by comparing the respective expressions for the readout noise in Equations (36) and (9). Comparison is facilitated by recognizing the relationship between the variable in Equations (36) and (9). The electro-thermal feedback term is given by $A=I_H Z_S g_M \partial E_F/\partial T$, with $\partial E_F/\partial T \approx -2$ mV/° K, and $(I_{NO}/g_M)^2 = dE_N^2/df$. Also, the thermal conductance $G_2^* \approx G_1^*$ and these are much larger $G_{D1}$ or $G_R$. The resistive bolometer's temperature coefficient $\partial R_{CB}/\partial T_S \approx 200$, and the bias current is about $I_{CR} \approx 0.1$ mA. Because the conventional bias current is large, it is pulsed and for a 400×500 element array, the value of $\omega_{EL} \approx 400 \times 500 \Delta_{BW}$. Inserting all these values reveals that for the same readout transistors the impact of the readout noise in the USSS is about 50 times smaller than in a conventional bolometer. The reduced impact of readout noise in the USSS over conventional bolometers indicates that the signal in the USSS is higher thereby making the readout noise less significant.

The third factor in Equation (36) represents the AC frequency response and is given as a ratio of a zero and pole. In conventional bolometers the AC factor in Equation (9) includes only a pole at $\omega_{TM}$. This pole is the bolometer's thermal time constant and pulsed readout makes this factor significantly greater than one and adversely degrades sensitivity. In the USSS the AC factor includes a pole and a zero. The pole is the absorber's time constant and the zero is the intermediate stage's time constant. Since pulsed readout is not used, the ratio of these as a function of frequency can be made equal to about one.

For an absorber element 10 heat capacity $C_1^*$ equal to about $C_1^* \cong 1.5 \times 10^{-1}$ J/° K, the thermodynamic sensitivity limit is about $(kT_S^2/C_1^*)^{1/2} \approx 0.1$ m° K. This is much more sensitive than the performance of conventional bolometers. The sensitivity degradation are due to thermal loading that decrease this by about 50X to about 5 m° K. Readout noise and bandwidth further reduces the sensitivity by about 4X, resulting in an NEΔT≈20 m° K. As a result, there is a need for improved sensitivity in conventional bolometers.

SUMMARY OF THE INVENTION

It is an object of the present invention to overcome the disadvantages of the prior art by increasing sensitivity while reducing power consumption.

An aspect of the invention is a bolometer pixel. The bolometer pixel has a detector stage, an intermediate stage, a heat bath and an electro-thermal feedback circuit. The electro-thermal feedback circuit has first and second diodes, first and second circuit elements, an amplifier and a heater. The first diode is contained in the detector stage. The second diode is contained in the intermediate stage. The cathode of the second diode is connected to the anode of the first diode. The first and second circuit elements are contained in the heat bath. The first and second circuit elements are connected in series. The amplifier includes a first input connected to the cathode of the second diode and the anode of the first diode, a second input connected to node between the first and second circuit components, and an output. The heater is connected to the output of the amplifier and heats the intermediate stage in accordance the temperature difference between the detector stage and the intermediate stage. The first and second diodes can be Schottky diodes. The first circuit element can be a third diode, and the second circuit element can be a fourth diode. The third and fourth diodes can be connected in series by the cathode of the fourth diode being connected to the anode of the third diode, and the second input can be connected to the cathode of the fourth diode and the anode of the third diode. The third and fourth diodes can also be Schottky diodes. The Schottky diodes can have a reverse bias saturation current of about one nanoampere. The Schottky diodes can have a junction diameter of about 2.3 micrometers. The first circuit element can be a first capacitor, and the second circuit element can be a second capacitor. The bolometer pixel can include a switch one side of the switch being connected to the first and second capacitors and the other side of the switch being connected to the cathode of the second diode and to the anode of the first diode. The heater can operate at a constant current and can be formed by a bias network and a heater field effect transistor (FET). The amplifier can be a differential complimentary metal-oxide-semiconductor (CMOS) circuit. The bolometer pixel can also have a first thermal isolation bridge between the detector stage and the intermediate stage, and a second thermal isolation bridge between the intermediate stage and the heat bath. The bolometer pixel can also have an associated readout circuit and a pixel row address switch. The bolometer pixel can be incorporated into a bolometer having a plurality of bolometer pixels and a column address switch for each column of the array.

Another aspect of the invention is an electro-thermal feedback circuit for a bolometer pixel having a detector stage, an intermediate stage and a heat bath. The electro-thermal feedback circuit includes a first diode contained in the detector stage, a second diode connected to the first diode in series and contained in the intermediate stage, and a heater which heats the intermediate stage to minimize the temperature difference between the detector and intermediate stage based on the voltage between the first and second diode. The detector stage absorbs and is heated by incident photons. The electro-thermal feedback circuit includes an amplifier which receives as an input the voltage between the first and second diode and outputs a signal to control the heater the heater to minimize the temperature difference between the detector and intermediate stage. The cathode of the second diode can be connected to the anode of the first diode. The first and second diodes can be Schottky diodes. The Schottky diodes can act as their own generator with there being no need to add a current generator.

An additional aspect of the invention is an active thermal isolation method. The active thermal isolation method includes heating a second stage to minimize the temperature difference between the second stage and a first stage using a voltage between a first diode contained in the first stage and a second diode contained in the second stage and connected in series with the first diode. The first stage can absorb and be heated by energy from incident photons. The cathode of the second diode can connected to the anode of the first diode. The first and second diodes can be Schottky diodes. The active thermal isolation method can include comparing the voltage between the first diode and the second diode with a voltage between third and fourth diodes connected in series and contained in a heat bath. The active thermal isolation method can include comparing the voltage between the first diode and the second diode with a voltage between first and second capacitors connected in series and contained in a heat bath.

Another aspect of the invention is an active thermal isolation method for a bolometer pixel with a first stage containing a first diode and second stage containing a second diode connected in series to the first diode. The active thermal isolation method includes using temperature-change-induced variation in saturation currents of the first diode and the second diode to heat the second stage so as to minimize the temperature difference between the second stage and the first stage. The first stage can be heated with the energy from incident photons. The cathode of the second diode can be connected to the anode of the first diode. The first and second diodes can be Schottky diodes. The temperature-change-induced variation can be used by comparing a voltage between the first and second diodes to a constant voltage. The constant voltage can be a voltage between third and fourth diodes connected in series and maintained at a constant temperature. The third and fourth diodes can be contained in a heat bath. The constant voltage may be a voltage between first and second capacitors connected in series and maintained at a constant temperature. The first and second capacitors may be contained in a heat bath. The method may include performing calibration to remove voltage errors due to variations between the first and second diodes. The performing calibration may include recording a voltage error in the first and second capacitors. The voltage error may be recorded by momentarily connecting a switch connected to the first and second diodes on one end and to the first and second capacitors on the other.

Some advantages that may be obtained by practicing the present invention include improving sensitivity of the bolometer pixel and reduced power consumption. Other aspects, embodiments, features and advantages of the invention will become apparent to those of skill in the art upon reviewing the following detailed description of the preferred embodiments and the accompanying drawings.

DETAILED DESCRIPTION OF THE PREFERRED EMBODIMENTS

Figure 1:
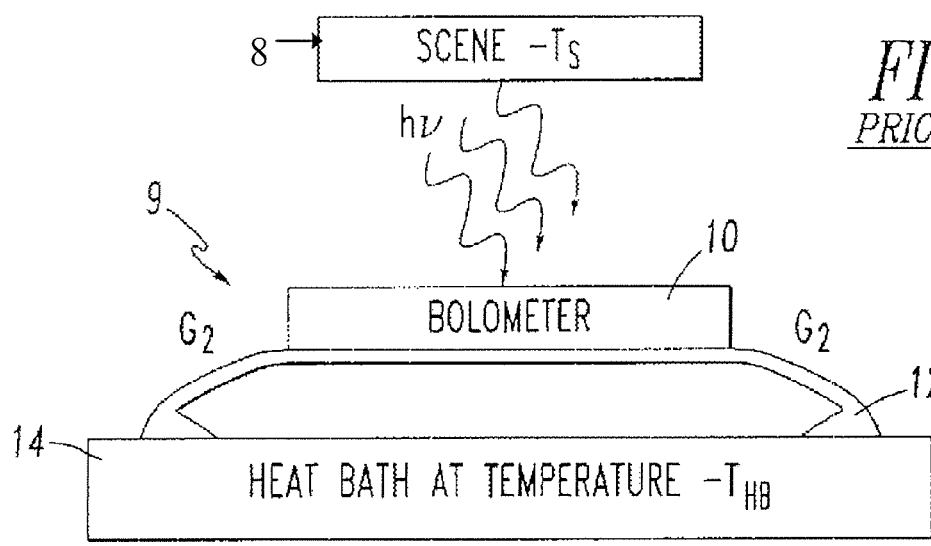
FIG. 1 is a side view of a prior art bolometer with a detector attached to a thermal isolation bridge on top of a substrate including a heat bath.
Figure 2:
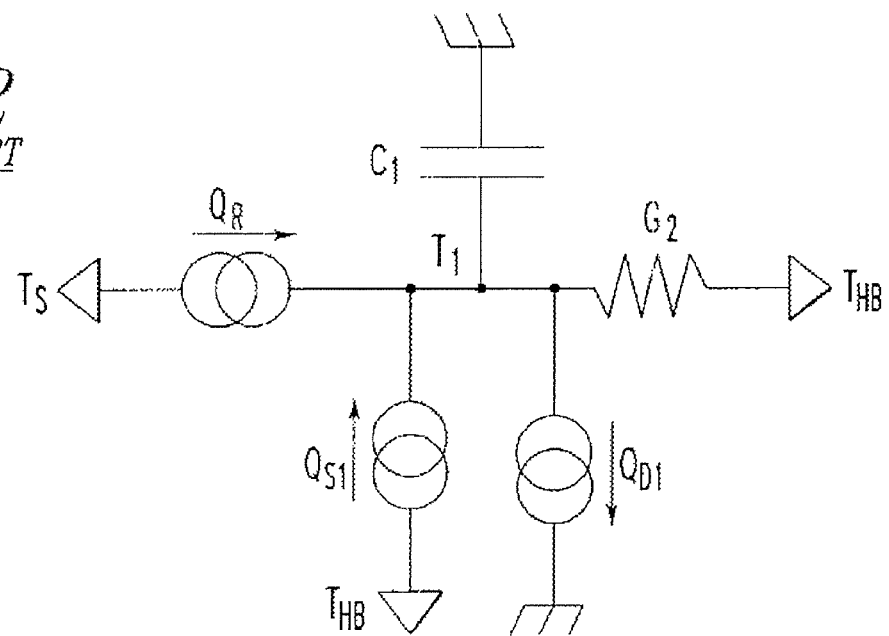
FIG. 2 is a thermal equivalent circuit for the bolometer shown in FIG. 1.
Figure 3:
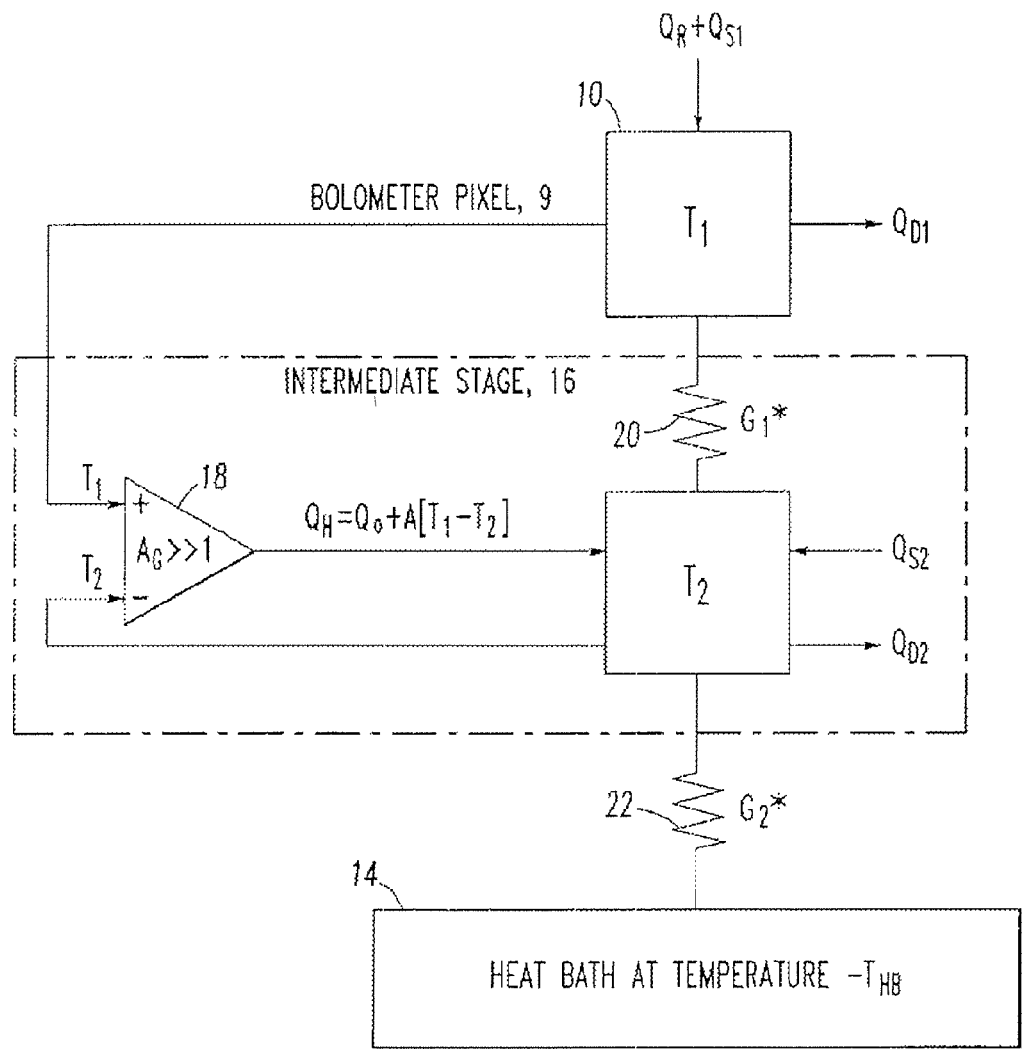
FIG. 3 is an electrical block diagram illustrating a prior art USSS bolometer with an electro-thermal feedback circuit incorporating three temperature tiers.
Figure 4:
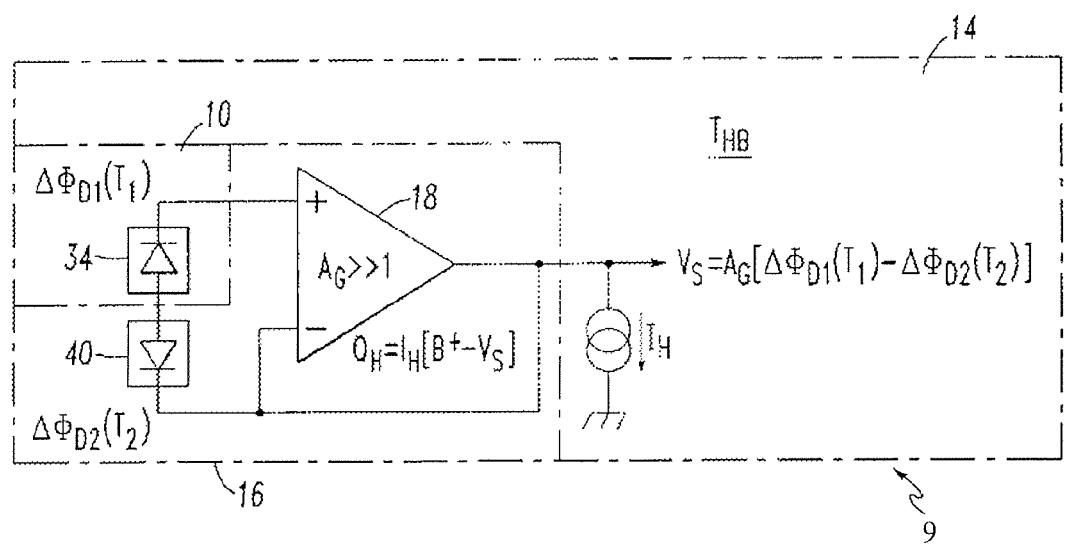
FIG. 4 is an electrical circuit diagram illustrating a prior art USSS bolometer with an electro-thermal feedback circuit configured with two back-to-back diodes.
Figure 5:
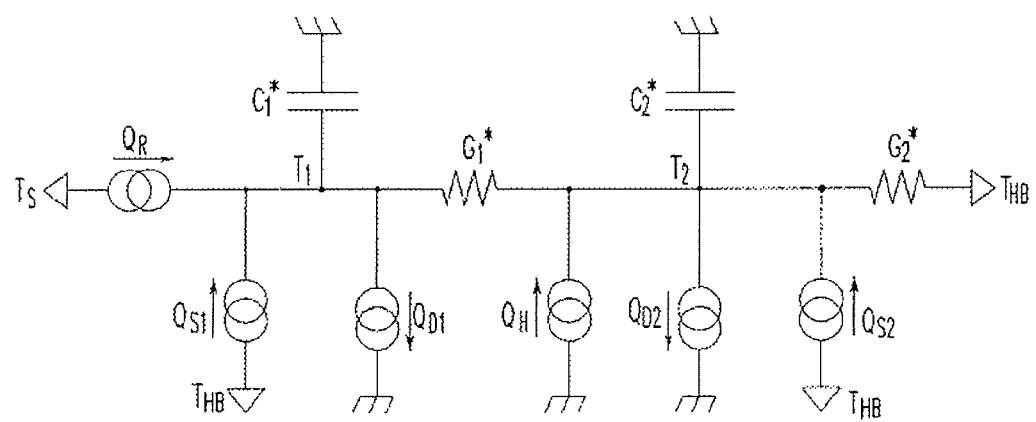
FIG. 5 is a thermal equivalent circuit of the USSS bolometer shown in FIG. 3.
Figure 6:
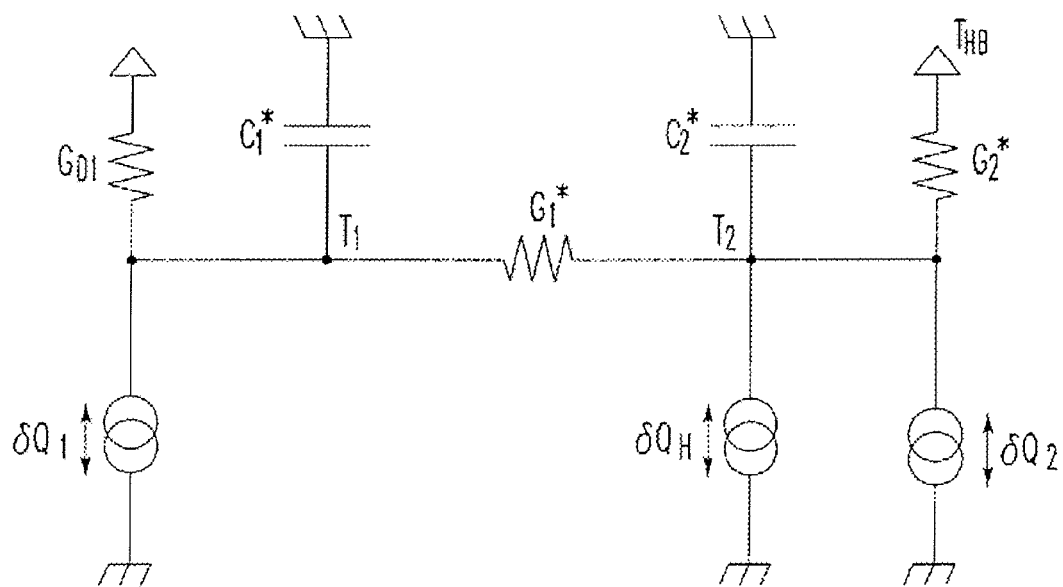
FIG. 6 is a thermal equivalent circuit for noise sources associated with the USSS bolometer shown in FIG. 3.
Figure 7:
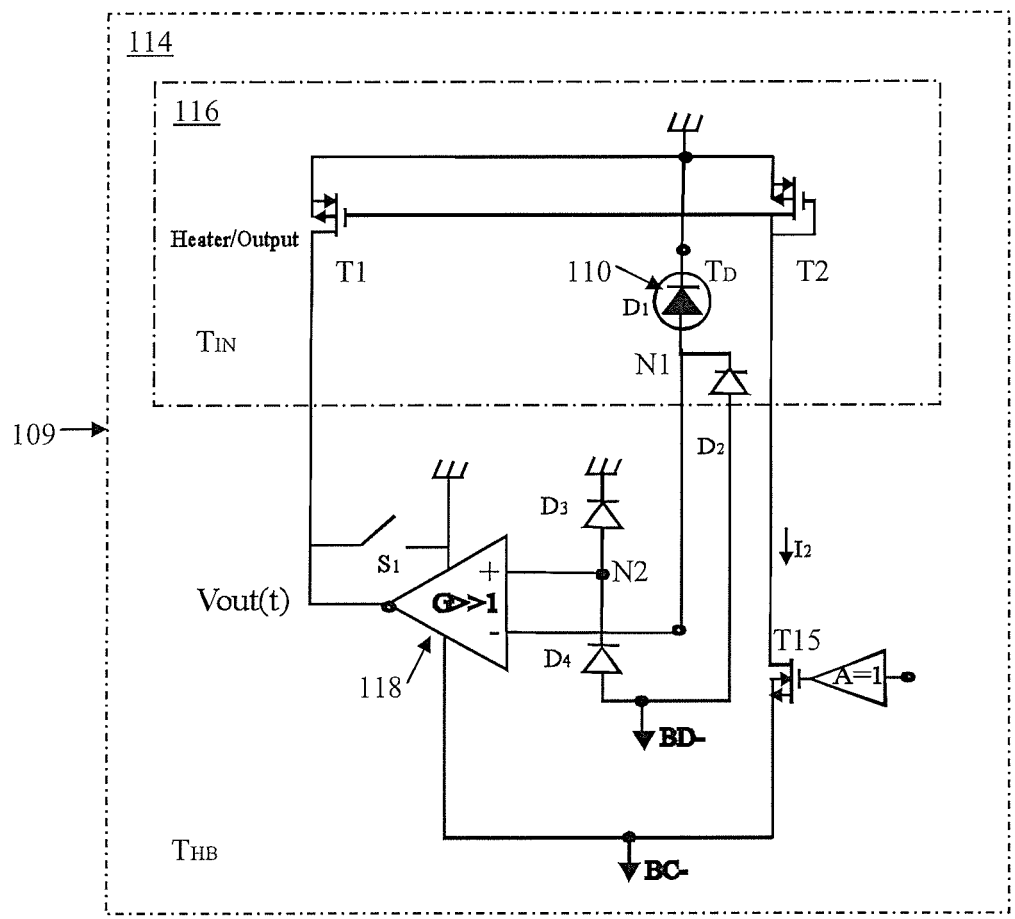
FIG. 7 is a simplified electrical circuit diagram illustrating a bolometer with an electro-thermal feedback circuit according to an embodiment of the present invention.

A diagram of a bolometer pixel 109 with an electro-thermal feedback circuit according to an embodiment of the present invention is shown in FIG. 7. A plurality of such pixels can be arranged in an array, such as in rows and columns, to create nil array of pixels to form a focal plane with bolometer pixels. Each bolometer pixel 109 includes a detector stage 110, an intermediate stage 116, and a heat bath stage 114. Within each pixel, the detector, intermediate and heat bath stages are connected in spaced relation to on another by a low thermal conductance bridge structure, e.g., as described in U.S. Pat. No. 7,361,900 entitled "'I' Beam Bridge Interconnection for Ultra-Sensitive Silicon Sensor," U.S. Pat. No. 7,064,328 entitled "Ultra Sensitive Silicon Sensor Millimeter Wave Passive Imager" or U.S. Pat. No. 6,489,615 entitled "Ultra Sensitive Silicon Sensor," the disclosures of which are incorporated herein by reference. It will be appreciated that the bolometer pixel can be fabricated in accordance with any known design or method of manufacture. The heat bath stage fowls a common thermal reference to the plurality of such pixels.

The temperatures of detector stage 110, intermediate stage 116 and heat bath 114 are $T_D$, $T_{IN}$ and $TH_B$, respectively. The electro-thermal feedback circuit performs active thermal isolation by heating the intermediate stage 116 to minimize the temperature difference between the intermediate stage 116 and the detector stage 110. The result is minimized thermal conductivity between the detector stage 110 and the intermediate stage 116, effectively minimizing the thermal conductivity from the detector stage to the environment, including the intermediate stage, thermally isolated from the heat bath stage 114.

The detector stage 110, containing diode D1, is mechanically and electrically connected through thermal isolation bridges to the intermediate stage 116. The intermediate stage, containing diode D2, is mechanically and electrically connected through thermal isolation bridges to the heat bath stage 114. Diodes D1 and D2 are connected in series such that the cathode of diode D2 is connected to the anode of diode D1. Diodes D1 and D 2 are used as temperature sensing diodes. The heat bath stage 114 contains diodes D3 and D4. Diodes D3 and D4 are connected in series such that the cathode of diode D4 is connected to the anode of diode D3. Diodes D3 and D4 are thermally isolated from diodes D1 and D2, are held at a constant temperature $T_{HB}$, and provide a voltage reference. An amplifier 118 amplifies the temperature difference ($T_D$-$T_{IN}$) between detector stage 110 and intermediate stage 116. The inputs of amplifier 118 are connected to the node N1, where diodes D1 and D2 are connected, and to the node N2, where diodes D3 and D4 are connected, respectively. The output of amplifier 118 functions as the USSS pixel 109 readout signal and as a control signal for a heater formed by bias network T2 and heater field-effect transistor (FET) T1. Because reverse bias Schottky diodes exhibit better temperature sensitivity than pin diodes forward biased with a constant current, diodes D1-D4 are Schottky diodes in a preferred embodiment. The benefits of using Schottky diodes are discussed in a later section.

In operation, the detector stage 110 absorbs incident photons and is thereby heated. Changes in temperature change how the voltage divides between the two temperature sensing diodes D1 and D2. The current flowing through the diodes is the reverse bias saturation current and is designed to be about one nano ampere. As the temperature changes, the saturation currents for diodes D1 and D2 change, and this produces a voltage change at the node N1, which is the point where diodes D1 and D2 are connected in series. The resulting voltage signal is a reflection of the relative temperatures of detector stage 110 and intermediate stage 116. If the detector stage 110 and the intermediate stage 116 are at the same temperature (i.e., $T_D=T_{IN}$), the voltage across each series diode will be equal, and the voltage at the node N1 will be equal to the voltage at node N2, which is the point where diodes D3 and D4 are connected. On the other hand, if the detector stage 110 and the intermediate stage 116 are at the different temperatures (i.e., $T_D \neq T_{IN}$), the voltage across diodes D1 and D2, respectively, will not be equal, and the voltage at node N1 will be different than the voltage at the node N2. Accordingly, an error voltage signal is produced and this voltage error signal is proportional to the temperature difference ($T_D-T_{IN}$) between detector stage 110 and intermediate stage 116.

The heater supplies a power to heat intermediate stage 116 in accordance with the error voltage signal produced by the temperature difference between the intermediate stage 116 and the detector stage 110. The heater is designed to operate at a constant current. The heater output power into the intermediate stage is monotonically proportional to the output voltage signal applied to the drain of FET T1. The voltage applied to the drain of NET T1 is produced by amplifier 118 in response to the input voltages; one input is from the node N1 between diodes D1 and D2 connected in series, and a second input is from the node N2 between diodes D3 and D4 connected in series.

As mentioned above, diodes D1 and D2 are preferably Schottky diodes. Schottky diodes exhibit a very large reverse bias dynamic resistance. Hence, temperature changes in the detector stage 110 relative to the intermediate stage 116 produce an imbalance in the reverse bias currents of Schottky diodes D1 and D2. This current imbalance, translated into a voltage signal, results in a very large responsivity of about 100 mV/° K. This voltage responsivity is about 100 times larger than the voltage responsivity of forward biased p/n junctions, which operate at higher currents, and consume more power. This voltage responsivity can further be increased with larger reverse bias current, for example 50 nA. However, for many applications it has been found that the 1 nA reverse bias Schottky current design provides good performance while minimizing the ($I^2$)R power consumption in the Schottky diodes. The 1 nA nominal reverse bias Schottky current is obtained by selecting Schottky diode metal, the silicon doping concentration, and junction area in the manner described below.

Figure 8:
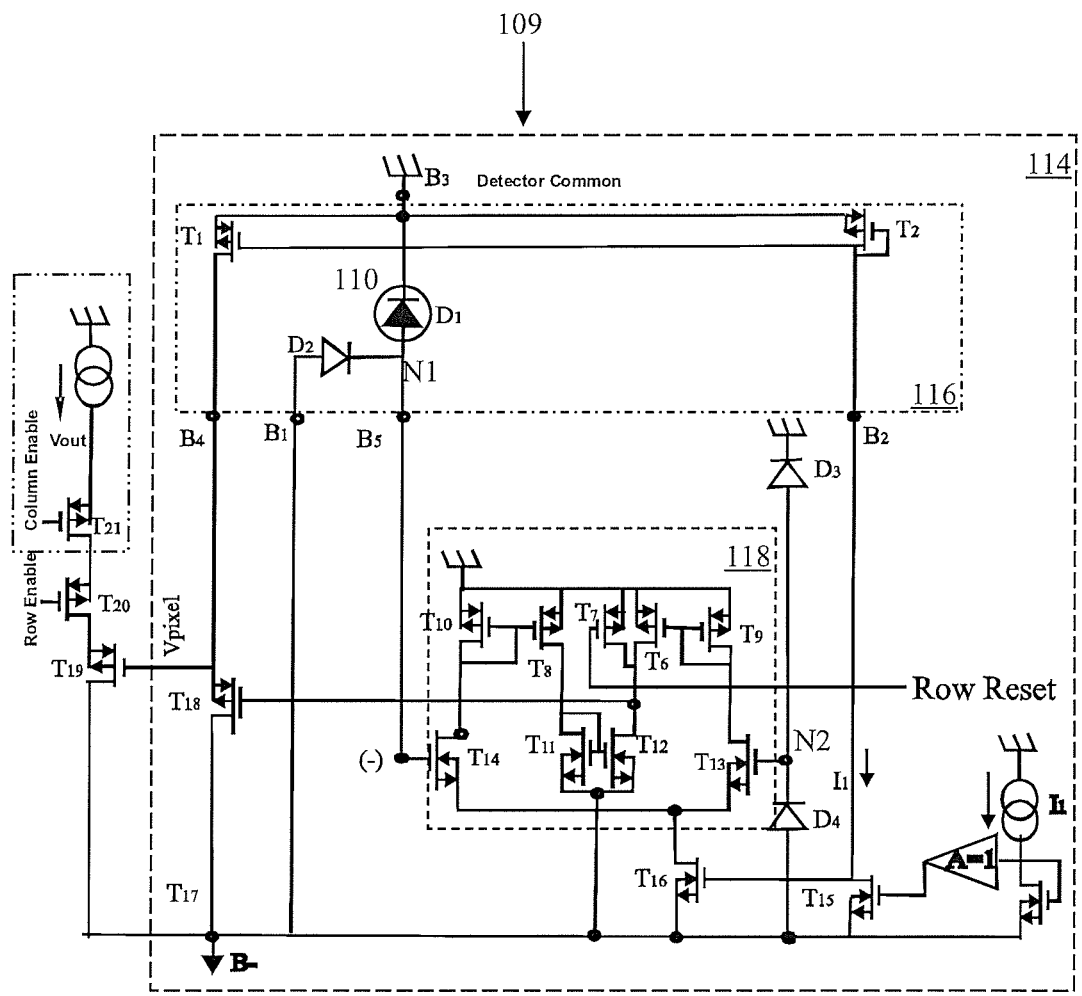
FIG. 8 is an electrical circuit diagram illustrating a bolometer with an electro-thermal feedback circuit according to an embodiment of the present invention.

In the embodiment shown in FIG. 8, the amplifier 118 is a differential complimentary metal-oxide-semiconductor (CMOS) circuit biased with a current produced by transistor T16. The current from the drain of transistor T16 is divided between the input FETs T13 and T14 and mirrored within the amplifier by a first mirror circuit comprised of transistors T10 and T8, a second mirror circuit comprised of transistors T9 and T6, and a third mirror circuit comprised of transistors T11 and T12. The difference between the channel currents in FETs T13 and T14 produces the output voltage signal. The two channel current difference is obtained by replicating twice the current flowing in channel FET T14 with the first and third mirror circuits and replicating once the current flowing in channel of FET T13 with the second mirror circuit. After two replications, channel current in FET T14 equals the channel current in FET T12 and currents flow in the same direction. After a single replication, the channel current in BET T13 equals the channel current in FET T6 and flow in opposite directions. A large voltage gain of greater than 40 dB is obtained by combining the counter flowing currents in channel FET T12 and channel FET T6. The output voltage of the differential amplifier drives the heater FET T1 through a source follower stage made with FET T18. The electro-thermal coefficient "A" for the combination of the Schottky diode temperature sensor, the heater current, and the 40 dB amplifier gain is about $10^{-4}$ W/° K. This larger electro-thermal coefficient (A equals about $10^{-4}$ W/° K) is much larger (100 times) than the thermal conductivity of the thermal isolation bridges. The large electro-thermal coefficient reduces the effective thermal conductivity of the bridges by about 100 times.

In the present invention, having the temperature sensing diodes D1 and D2 connected in series instead of the conventional back-to-back design increases the dynamic range of the circuit and simplifies the design. All the diodes can be the same size in the series design. In the back-to-back design, the load diodes need to be adjusted in area to accommodate the temperature range anticipated for the bolometer. In the series design, when the detector and intermediate stage temperatures are equal (i.e., $T_D=T_{IN}$), the voltage at node N1 where the series diodes connect is equal to B-12. With the back-to-back design, the common mode voltage to the CMOS amplifier will change with temperature even though the detector and intermediate stages are at the same temperature. With the series diode arrangement, the same common mode voltage will be presented to the CMOS amplifier as long as the detector and intermediate stages are at the same temperature.

At the end of each integration time, the amplifier 118 output is gated off by the reset switch T7. When the switch T7 is turned on, the amplifier's voltage output minimizes the heater power delivered to the intermediate stage 116. This causes the detector stage 110 and intermediate stage 116 to converge in temperature. When the switch T7 is turned off, the electro-thermal feedback loop is reestablished, and, as the detector stage 110 starts heating up, its temperature change will be tracked by the intermediate stage 116. The temperature tracking reduces the effective thermal conductance (or thermal loading) of the bridges between the detector and intermediate stages by about 100 times. With the reduced thermal loading by 100X, the responsivity improves, and the signal will correspondingly increase. Furthermore, the pulsed operation of the electro-thermal feedback loop avoids the problem of loop oscillation and transients, by establishing initial electro-thermal conditions with very small temperature differences between detector and intermediate stages.

Included in each bolometer pixel 109 are: a readout FET $T_{19}$ and pixel row address FET switch $T_{20}$. A column address switch $T_{21}$ is shown in FIG. 8 but is not part of the bolometer pixel 109 circuitry. Instead, column address switch $T_{21}$ is part of the bolometer pixels FPA array into which the column of bolometer pixels 109 is intended to be incorporated, and a single switch is used for each column. The output FET for the entire FPA is provided by the combination of the column enable FET $T_{21}$ and the output current shared for all the outputs. Multiple outputs FET can be utilized with a single bolometer focal plane array. Transistor $T_{15}$ globally controls the amplifier quiescent current and the heater current. In the present design, the heater and amplifier currents are about 1 µA each. Thus, the power consumed by each pixel is only about 10 µWatts.

In another embodiment, the bridge made up of four Schottky diodes D1-D4, which produces the input to amplifier circuit 118, may alternatively be made up of only two diodes in series and a midpoint reference instead.

The improved temperature sensitivity achieved through use of the Schottky diodes connected in series is discussed below.

Schottky diode characteristics are given by an equation similar to the pin junction diode, and is, $$I(V,T)=I_S(V,T)[\exp(qV/kT)-1] \quad (37)$$

This equation is very similar in format to the equation for a pin junction diode. The difference is in the expression for the Schottky diode saturation current $I_S(V,T)$. The expressions for a Schottky and p/n junction diodes saturation currents are different, and the equation for a Schottky diode's saturation current is given by, $$I_S(V, T) = AA^{**}T^2 \exp\left[\frac{q}{kT}(-\Phi_{MS} + \Delta\phi)\right] \quad (38)$$

where A is the Schottky diode area, A** is the Richardson constant, $\Phi_{MS}$ is the Schottky barrier height and $\Delta\phi$ is the amount the Schottky barrier height is lowered with reverse bias. The expression for the amount of Schottky barrier lowering with reverse bias is given by, $$\Delta\phi = \left[\frac{q^{0.75}N_D^{0.25}}{2^{0.75}\pi^{0.5}\varepsilon_S^{0.75}}\right][\Phi_{MS} - V - (kT/q)\text{Ln}(N_C/N_D) - (kT/q)]^{0.25} \quad (39)$$

Where, $\varepsilon_S$, $N_C$, $N_D$ and V are, respectively, is the dielectric constant for Silicon, the effective density of states in the conduction band, the donor doping level in the substrate, and the Schottky's reverse bias voltage.

From Equation (39) it is evident that the effective Schottky barrier $\Phi_{MS}$ will be reduced with higher silicon substrates doping $N_D$ and larger reverse bias voltage V. Thus, the Schottky saturation current $I_S(V,T)$ will increase with reverse bias and temperature.

The saturation current varies differently in p/n junction diodes than in Schottky diodes. The saturation current depends on intrinsic and extrinsic parameters. Unlike invariant intrinsic parameters, extrinsic parameters (like process variations) contribute to device variations and result in temperature measurement errors. A p/n junction diode's saturation current will vary directly with the extrinsic parameters: junction area A and doping concentration as $1/N_D$. A Schottky diode's saturation current will vary directly with the extrinsic junction area parameter of A, but only very weakly with the extrinsic parameter of doping concentration $N_D$. The very weak variation with $N_D$ is because the numerical coefficient in Equation (39) for $[N_D]^{0.25}$ is $8.16\times10^{-8}$, and this is much smaller than the coefficient in a p/n diode that for $1/N_D$, equal to about 5. Thus the extrinsic contributor to Schottky diode saturation current is the junction area, and the substrate doping variations are neglected.

The second advantage offered by a Schottky diode is an adjustable saturation current with the Schottky barrier $\Phi_{MS}$, something that cannot be done with conventional p/n junction diodes.

Adjusting the Schottky diodes saturation current with barrier $\Phi_{MS}$ offers two very important advantages. First there is no need for a adding a separate current generator circuit because the Schottky diode acts as its own current generator. Second, the sensitivity of temperature measurements is adjustable with the Schottky diode's saturation current. The temperature sensitivity at the reverse bias Schottky temperature sensor depends on the noise from the diode saturation current $I_S(V,T)$ and the current signal determined from changes in the diode's saturation current with temperature, $\partial I_S(V,T)/\partial T$. The Schottky diode noise temperature resolution $\Delta T_{Diode}$ is given as, $$\Delta T_{Diode} = \frac{\sqrt{2qI_S(V,T)\Delta_{BW}}}{\partial I_S(V,T)/\partial T} \quad (40)$$

Temperature resolution at the Schottky temperature sensor depends directly on the variations in the saturation current and improves with minimum electrical bandwidth $\Delta_{BW}$ and inversely with the value of the saturation current. Specifically, the temperature resolution $\Delta T_{Diode}$ improves as the reciprocal of the saturation current's square root. This dependence is deduced by recognizing that in Equation (40) the numerator varies as square root of the Schottky diode area "A" and the denominator varied linearly with diode area "A." Since the Schottky diode saturation current varies directly with area, the sensitivity improves with $[A]^{-0.5}$.

The value selected for the Schottky diode saturation current depends on the denominator in Equation (40). The temperature dependence of the Schottky saturation current is computed from the derivative of Equation (38) and this is given by, $$\partial I_S(V,T)/\partial T = I_S(V,T)\left[\frac{2}{T} + \frac{q}{kT^2}(\Phi_{MS} - \Delta\phi) + \frac{\partial\Delta\phi}{\partial T}\right] \quad (41)$$

The saturation current's temperature dependence scales directly with the saturation current's amplitude multiplied by three terms (see right side of Equation (41)). The expression for the last term in Equation (41) is obtained by differentiating Equation (41), and the following is obtained, $$\frac{\partial\Delta\phi}{\partial T} = -\frac{k}{4q}\left[\frac{q^{0.75}N_D^{0.25}}{2^{0.75}\pi^{0.5}\varepsilon_S^{0.75}}\right] \quad (42)$$

$$\frac{[\text{Ln}(N_C/N_D)+1]}{[\Phi_{MS} - V - (kT/q)\text{Ln}(N_C/N_D) - (kT/q)]^{0.75}} \approx 3.4\times10^{-6}$$

An approximation for the Schottky diode saturation current's temperature dependence is obtained with a numerical estimate of the right most factor in Equation (41) leading to a simplified expression given by, $$\partial I_S(V,T)/\partial T \approx (0.07)I_S(V,T) \quad (43)$$

The noise limited temperature resolution of the Schottky diode sensors is readily estimated by combining Equations (43) and (42) to obtain a simplified expression for the temperature sensitivity given by, $$\Delta T_{Diode} \cong \frac{1}{0.07}\sqrt{\frac{2q\Delta_{BW}}{I_S(V,T)}} \cong 2.5 \times 10^{-4}\sqrt{\Delta_{BW}}\bigg|_{at1nA} \qquad (44)$$

Designing a Schottky diode with a saturation current of $10^{-9}$ amps and operating in a 60 Hz bandwidth will provide a 2 m° K temperature resolution. The temperature resolution can be improved by narrowing the electrical bandwidth or increasing the saturation current (e.g., to about 50 nA). However, it is desirable to minimize the $I^2R$ power consumed by the Schottky diode. Accordingly, in the present invention, the saturation current is limited to about $10^{-9}$ amps and the electrical bandwidth is reduced to obtain better temperature resolution.

The saturation current temperature signal is changed to a voltage with a large resistive load provided by diode D2. The resistive load is obtained by reverse biasing Schottky diode D2, with a back biased resistance greater than $10^9$ Ohms. The current noise from the resistive load D2 needs to be much less than the noise current in the temperature sensor $D_1$. The expression for the noise current from $D_1$ is given by the numerator in Equation (44). For a saturation current of $10^{-9}$ amps the noise current is equivalent to a $5 \times 10^7$ Ohms resistor. Thus the noise current from $D_2$ with a $10^9$ Ohms dynamic resistance is negligible.

A large temperature responsivity voltage signal is obtained from the Schottky diodes D1 and D2 connected in series. The responsivity is readily computed with Equation (41). For a le amps saturation current and a $D_2$ load greater than $10^9$ Ohms, the temperature responsivity voltage signal is greater than 70 mV/° K. This temperature responsivity represents almost a 100 times improvement over the temperature responsivity with a forward biased pin junction silicon diode. As a result, in the present invention, the pin diodes are replaced with temperature sensing Schottky diodes operating at a $10^{-9}$ amps saturation current.

Schottky diodes D1-D4 preferably have small areas and small saturation current of about $10^{-9}$ Amps Design constrains limit the junction's diameter to about 2.3 µm. After careful examination of Equations (38) and (40), it was determined that, for $10^{-9}$ Amps, the needed Schottky barrier height $[\Phi_{MS}]$ is equal to 0.53 eV. Such a barrier height is obtained for a $TiSi_2$ silicide formed over a p-type silicon tub.

Figure 9:
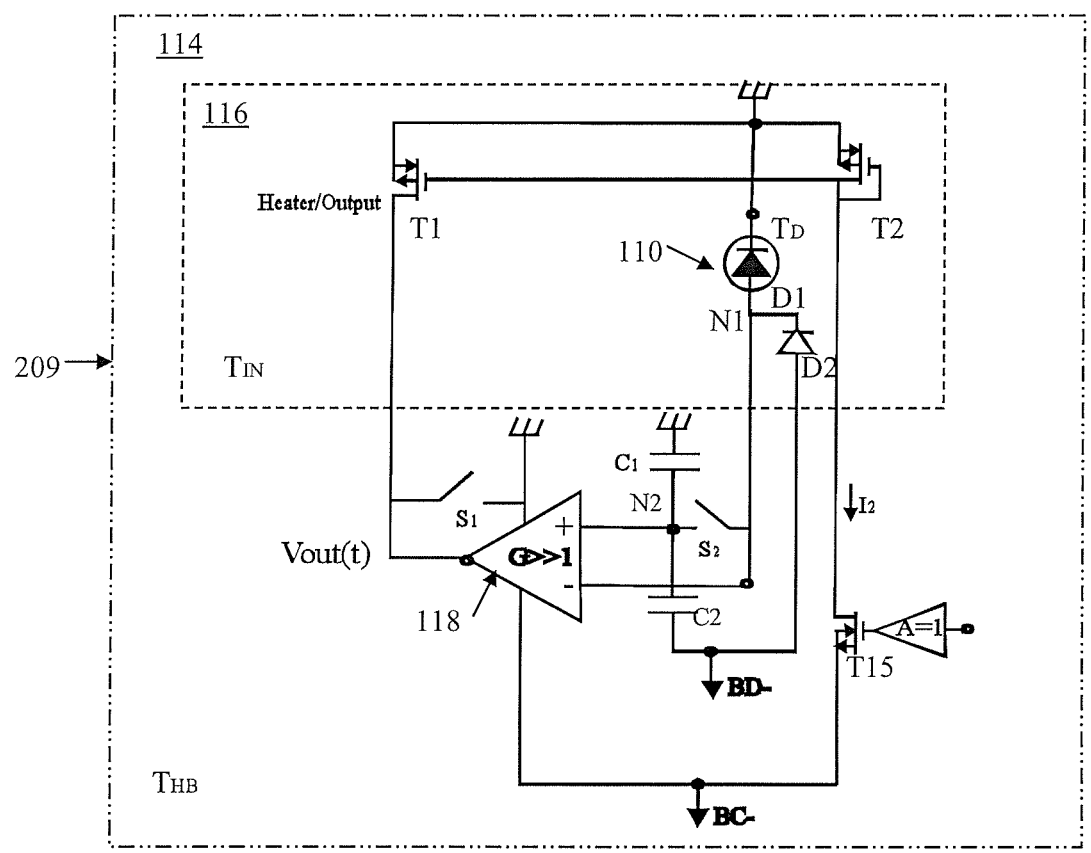
FIG. 9 is a simplified electrical circuit diagram illustrating a bolometer with a normalized electro-thermal feedback circuit according to an embodiment of the present invention.

A bolometer pixel 209 with a normalized electro-thermal feedback circuit according to an embodiment of the present invention is shown inn. FIG. 9. Bolometer pixel 209 is similar in structure and operation to the bolometer pixel 109 according to the embodiment shown in FIG. 7. However, bolometer pixel 209 is designed to remove error differences due to local diode variations.

Figure 10:
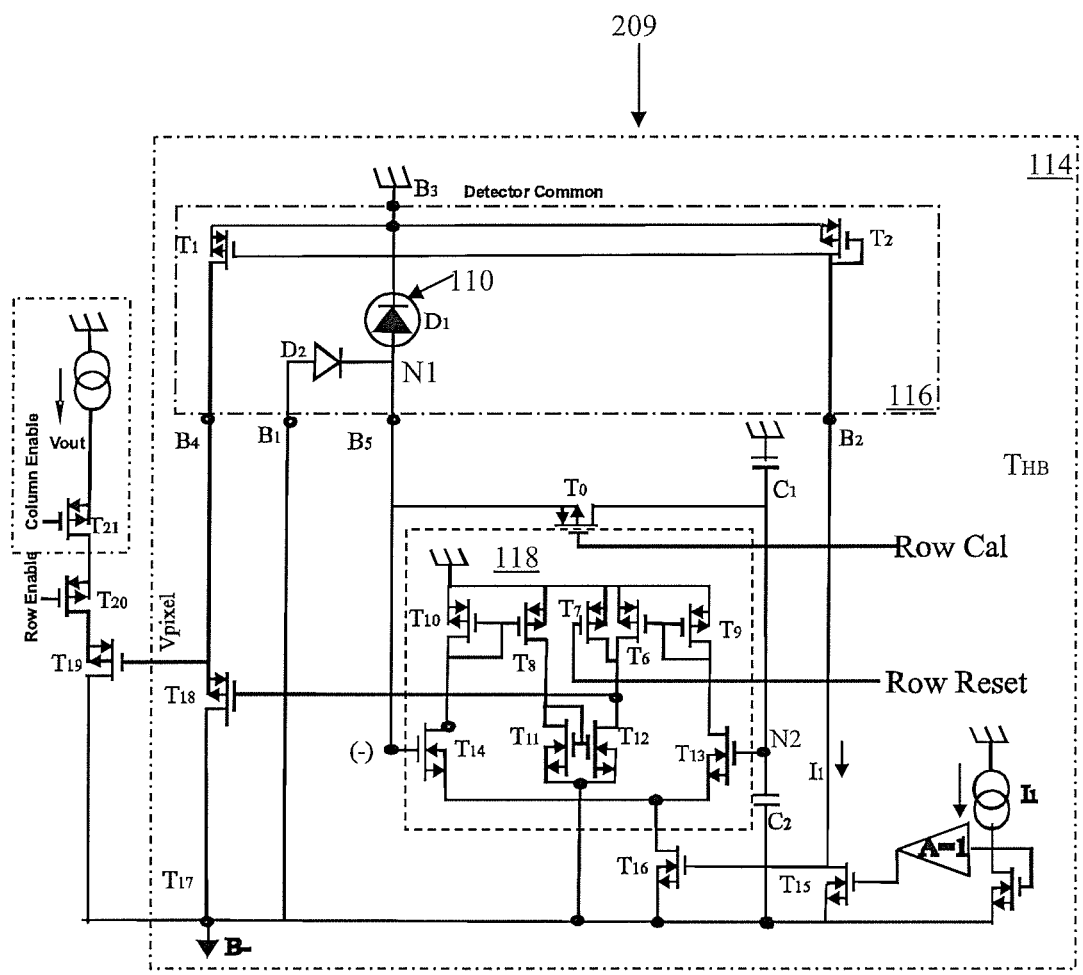
FIG. 10 is an electrical circuit diagram illustrating a bolometer with a normalized electro-thermal feedback circuit according to an embodiment of the present invention.

In the embodiment shown in FIG. 9, heat bath stage 114 contains capacitors C1 and C2. Capacitors C1 and C2 are connected in series. Capacitors C1 and C2 are thermally isolated from diodes D1 and D2, and are held at a constant temperature MB, and provide a voltage reference. Details of the amplifier and electro-thermal feedback circuit are shown in FIG. 10. An amplifier 118 amplifies the temperature difference ($T_D$-$T_{IN}$) between detector stage 110 and intermediate stage 116. The inputs of amplifier 118 are connected to the node N1, where diodes D1 and D2 are connected, and to the node N2, where capacitors C1 and C2 are connected, respectively. The output of amplifier 118 functions as the USSS pixel 209 readout signal and as a control signal for a heater formed by bias network T2 and heater field-effect transistor (FET) T1. A switch S2 is connected between nodes N1 and N2.

In operation, bolometer pixel 209 operates similarly to bolometer pixel 109 but with the reference voltage at node N2 being provided by capacitors C1 and C2 instead of diodes D3 and D4. In addition, removal of any systematic error due to differences in the diode characteristics is performed with the aid of the two capacitors C1 and C2 and the switch S2.

Ideally, when the temperatures $T_D$ and $T_{IN}$ of the detector and intermediate stages 110 and 116 are the same signals, the voltage across each of the diodes D1 and D2, connected in series, should be equal. However, differences between the diodes D1 and D2 will result in a different voltage across diodes D1 and D2. The operation of the electro-thermal feedback circuit will be compromised if this systematic voltage error, interpreted as a temperature error, is not removed.

Diodes D1 and D2, to first order, depend primarily on the junction area and the Schottky barrier height. The Schottky barrier height is intrinsic and the process was adjusted for the uniform formation of $TiSi_2$. Thus, variations in the Schottky diode characteristics are expected to be due to extrinsic variations in the diode junction areas. Variations in diode junction area produce errors which are temperature independent. Specifically, as long as the detector and intermediate stages 110 and 116 are at the same temperature, the voltage error does not change. The electro-thermal feedback equalizes the temperatures of the detector and intermediate stages 110 and 116, and this equalization keeps the voltage error constant. The voltage error due to variations in diode junction areas is recorded with the capacitors C1 and C2 when switch S2 is on. Switch S2 is turned on momentarily to connect and record the voltage at the junction between the two Schottky diodes D1 and D2 on the capacitors C1 and C2.

The calibration to remove the voltage errors due to variations in Schottky diode areas has to be performed when the detector and intermediate stages 110 and 116 are at the same temperature (i.e., $T_D$=$T_{IN}$). This is mechanized by turning off the heater and shuttering the radiation on the pixel 209. The heater is turned off when switch S1 is turned on and the incident radiation can be shuttered with a chopper or an electrical switch to turn off the microantenna. The chopper may be a mechanical chopper or an electrical chopper. Thus when switch S2 is turned on, the error voltage is recorded on the capacitors C1 and C2.

The recording of the error voltage is performed as part of operating pixel 209. Before each integration time, the calibration step described above is performed. The calibration is completed by opening switch S2 first and then the heater switch S1. Next, the shutter is opened and the electro-thermal feedback loop resumes its operation. Any errors in the bridge formed by diodes D1 and D2 and capacitors C1 and C2 are removed by the time the feedback loop's operation is resumed.

It is noted that, because of the large thermal time constants, the electro-thermal feedback circuit never reaches steady state operation. Operation in a transient mode alleviates the issue of oscillation in the electro-thermal feedback loop.

In FIG. 10, a bolometer pixel 209 with a normalized electro-thermal feedback circuit according to an embodiment of the present invention is shown. Bolometer pixel 209 is similar in structure and operation to the bolometer pixel 109 shown in FIG. 8. However, the bolometer pixel 209 shown in FIG. 10 is designed to remove error differences due to local diode variations in a manner similar to the bolometer pixel 209 shown in FIG. 9. As shown in FIG. 10, nodes N1 and N2 are connected by transistor T0, which acts as a switch controlled by the row calibration signal Row Cal. As a result, when the row calibration signal Row Cal turns transistor TO on, calibration to remove the voltage errors due to variations in Schottky diode areas of diodes D1 and D2 is performed by recording the error voltage on the capacitors C1 and C2.

While this invention has been described in conjunction with specific embodiments thereof, many alternatives, modifications and variations will be apparent to those skilled in the art. For example, while the present invention is preferably fabricated in silicon using well-known semiconductor fabrication techniques, embodiments of the present invention may be realized in semiconductor materials other than silicon. In addition, the diodes of the present invention may be Schottky, pin or other known types Also, while the present invention has been described as a bolometer, the electro-thermal feedback circuit can be used in any device requiring a stage to be isolated from a heat bath. Accordingly, the preferred embodiments of the invention as set forth herein, are intended to be illustrative, not limiting. Various changes may be made without departing from the true spirit and full scope of the invention as set forth herein.

The invention claimed is:

1. A bolometer pixel comprising:
   a detector stage;
   an intermediate stage;
   a heat bath; and
   an electro-thermal feedback circuit including:
      a first diode contained in the detector stage;
      a second diode contained in the intermediate stage, wherein the cathode of the second diode is connected to the anode of the first diode;
      a first circuit element contained in the heat bath;
      a second circuit element contained in the heat bath, wherein the first and second circuit elements are connected in series;
      an amplifier comprising:
         a first input connected to the cathode of the second diode and the anode of the first diode,
         a second input connected to the cathode of the first and second circuit elements, and
         an output; and
      a heater connected to the output of the amplifier to heat the intermediate stage in accordance the temperature difference between the detector stage and the intermediate stage.

2. The bolometer pixel of claim 1, wherein the first and second diodes are Schottky diodes.

3. The bolometer pixel of claim 2, wherein the first circuit element is a third diode, the second circuit element is a fourth diode, the third and fourth diodes are connected in series by the cathode of the fourth diode being connected to the anode of the third diode, and the second input is connected to the cathode of the fourth diode and the anode of the third diode.

4. The bolometer pixel of claim 3, wherein the third and fourth diodes are Schottky diodes.

5. The bolometer pixel of claim 4, wherein the Schottky diodes have a reverse bias saturation current of about one nanoampere to about fifty nanoamperes.

6. The bolometer pixel of claim 4, wherein the Schottky diodes have a junction diameter of about 2.3 micrometers.

7. The bolometer pixel of claim 2, wherein the first circuit element is a first capacitor, and the second circuit element is a second capacitor.

8. The bolometer pixel of claim 7, further comprising a switch, wherein one side of the switch is connected to the first and second capacitors and the other side of the switch is connected to the cathode of the second diode and to the anode of the first diode.

9. The bolometer pixel of claim 1, wherein the heater operates at a constant current and is formed by a bias network and a heater field effect transistor (FET).

10. The bolometer pixel of claim 1, wherein the amplifier is a differential complimentary metal-oxide-semiconductor (CMOS) circuit.

11. The bolometer pixel of claim 1, further comprising:
   first thermal isolation bridges between the detector stage and the intermediate stage; and
   second thermal isolation bridges between the intermediate stage and the heat bath.

12. The bolometer pixel of claim 1, further comprising:
   an associated readout circuit; and
   a pixel row address switch.

13. A bolometer comprising:
   a plurality of bolometer pixels as claimed in claim 1 assembled into an array, and
   a column address switch for each column of the array.

14. An electro-thermal feedback circuit for a bolometer pixel having a detector stage, an intermediate stage and a heat bath, said circuit comprising:
   a first diode contained in the detector stage,
   a second diode connected to the first diode in series and contained in the intermediate stage, and
   a heater which heats the intermediate stage to minimize the temperature difference between the detector and intermediate stage based on the voltage between the first and second diode;
   wherein the detector stage absorbs and is heated by incident photons.

15. The electro-thermal feedback circuit of claim 14, wherein the electro-thermal feedback circuit further comprises an amplifier which receives as an input the voltage between the first and second diode and outputs a signal to control the heater the heater to minimize the temperature difference between the detector and intermediate stage.

16. The electro-thermal feedback circuit of claim 14, wherein the cathode of the second diode is connected to the anode of the first diode.

17. The electro-thermal feedback circuit of claim 14, wherein the first and second diodes are Schottky diodes.

18. The electro-thermal feedback circuit of claim 17, wherein the Schottky diodes act as their own generator with there being no need to add a current generator.

19. An active thermal isolation method comprising heating a second stage to minimize the temperature difference between the second stage and a first stage using a voltage between a first diode contained in the first stage and a second diode contained the second stage and connected in series with the first diode, wherein the first stage absorbs and is heated by incident photons.

20. The active thermal isolation method of claim 19, wherein the cathode of the second diode is connected to the anode of the first diode.

21. The active thermal isolation method of claim 19, wherein the first and second diodes are Schottky diodes.

22. The active thermal isolation method of claim 19, further comprising comparing the voltage between the first diode and the second diode with a voltage between third and fourth diodes connected in series and contained in a heat bath.

23. The active thermal isolation method of claim 19, further comprising comparing the voltage between the first diode and the second diode with a voltage between first and second capacitors connected in series and contained in a heat bath.

24. An active thermal isolation method for a bolometer pixel with a first stage containing a first diode and second stage containing a second diode connected in series to the first diode, said method comprising using temperature-change-induced variation in saturation currents of the first diode and the second diode to heat the second stage so as to minimize the temperature difference between the second stage and the first stage.

25. The active thermal isolation method of claim 24, wherein the first stage is heated through the absorption of incident photons.

26. The active thermal isolation method of claim 24, wherein the cathode of the second diode is connected to the anode of the first diode.

27. The active thermal isolation method of claim 24, wherein the first and second diodes are Schottky diodes.

28. The active thermal isolation method of claim 24, wherein the temperature-change-induced variation is used by comparing a voltage between the first and second diodes to a constant voltage.

29. The active thermal isolation method of claim 28, wherein the constant voltage is a voltage between third and fourth diodes connected in series and maintained at a constant temperature.

30. The active thermal isolation method of claim 29, wherein the third and fourth diodes are contained in a heat bath.

31. The active thermal isolation method of claim 28, wherein the constant voltage is a voltage between first and second capacitors connected in series and maintained at a constant temperature.

32. The active thermal isolation method of claim 31, wherein the first and second capacitors are contained in a heat bath.

33. The active thermal isolation method of claim 31, further comprising performing calibration to remove voltage errors due to variations between the first and second diodes.

34. The active thermal isolation method of claim 33, wherein the performing calibration comprises recording a voltage error in the first and second capacitors.

35. The active thermal isolation method of claim 34, wherein the voltage error is recorded by momentarily connecting a switch connected to the first and second diodes on one end and to the first and second capacitors on the other.

* * * * *